United States Patent
Bozorgi

(10) Patent No.: US 11,859,914 B2
(45) Date of Patent: Jan. 2, 2024

(54) HIGH PERFORMANCE TWO-PHASE COOLING APPARATUS

(71) Applicant: PiMEMS, Inc., Pleasanton, CA (US)

(72) Inventor: Payam Bozorgi, Santa Barbara, CA (US)

(73) Assignee: PIMEMS, INC., Pleasanton, CA (US)

( * ) Notice: Subject to any disclaimer, the term of this patent is extended or adjusted under 35 U.S.C. 154(b) by 105 days.

(21) Appl. No.: 17/457,328

(22) Filed: Dec. 2, 2021

(65) Prior Publication Data

US 2022/0099383 A1  Mar. 31, 2022

Related U.S. Application Data

(63) Continuation-in-part of application No. 16/543,428, filed on Aug. 16, 2019, now Pat. No. 11,215,403, which is a continuation of application No. 15/000,460, filed on Jan. 19, 2016, now Pat. No. 10,458,719.

(60) Provisional application No. 62/106,556, filed on Jan. 22, 2015.

(51) Int. Cl.
*F28D 15/04* (2006.01)
*F28D 15/02* (2006.01)

(52) U.S. Cl.
CPC ....... *F28D 15/046* (2013.01); *F28D 15/0233* (2013.01)

(58) Field of Classification Search
CPC .......................... F28D 15/0233; F28D 15/046
See application file for complete search history.

(56) References Cited

U.S. PATENT DOCUMENTS

| | | | |
|---|---|---|---|
| 6,843,308 B1* | 1/2005 | Duval | H01L 23/427 174/15.1 |
| 7,836,597 B2* | 11/2010 | Datta | H01L 21/4882 29/890.032 |
| 8,611,089 B2* | 12/2013 | Mizuta | F28D 15/0233 361/720 |
| 10,215,497 B2* | 2/2019 | Noishiki | F28D 9/0037 |
| 10,739,085 B2* | 8/2020 | Bungo | F28D 9/0031 |
| 2010/0044014 A1* | 2/2010 | Ho | F28D 1/035 29/890.03 |
| 2012/0208265 A1* | 8/2012 | Partsch | F28D 9/0043 429/81 |
| 2016/0259383 A1* | 9/2016 | Shioga | F28D 15/0266 |
| 2016/0290733 A1* | 10/2016 | Noishiki | F28D 9/0062 |

* cited by examiner

*Primary Examiner* — Gordon A Jones
(74) *Attorney, Agent, or Firm* — BOTKIN & HALL, LLP

(57) ABSTRACT

The present application discloses two-phase cooling devices that may include at least three substrates: a metal with a wicking structure, an intermediate substrate and a backplane. A fluid may be contained within the wicking structure and vapor chamber for transporting thermal energy from one region of the thermal ground plane to another region of the thermal ground plane, wherein the fluid may be driven by capillary forces within the wicking structure. The intermediate substrate may form narrow channels within the wicking structure, providing high capillary forces to support large pressure differences between the liquid and vapor phases, while minimizing viscous losses of the liquid flowing in the wicking structure.

11 Claims, 29 Drawing Sheets

Evaporator Region

Adiabatic Region

Condenser Region

Evaporator Region

HIGH PERFORMANCE TWO-PHASE COOLING APPARATUS

CROSS REFERENCE TO RELATED APPLICATIONS

This is a continuation application, claiming priority to U.S. patent application Ser. No. 16/543,428 filed Aug. 16, 2019, which claims the benefits of the U.S. Utility patent application with Ser. No. 15/000,460 filed Jan. 19, 2016, which claims priority to U.S. Provisional Application Ser. No. 62/106,556 filed Jan. 22, 2015. Each of these applications are incorporated by reference in their entirety.

BACKGROUND OF THE INVENTION

This invention relates to cooling of semiconductor devices, and, more particularly, to cooling systems to cool semiconductor and other devices.

Electronics employing various semiconductor devices and integrated circuits are commonly subjected to various environmental stresses. Applications of such electronics are extremely widespread, and utilize different semiconductor materials.

Many electronic environments, such as mobile devices or laptop computers, have thin/planar configurations where many components are efficiently packed into a very confined space. As a result, cooling solutions must also conform to thin/planar configurations. Heat spreaders, in the form of thin thermal ground planes (TGPs), may be desirable for many electronic cooling applications.

SUMMARY OF THE INVENTION

The present application discloses two-phase cooling devices. Two-phase cooling devices are a class of devices that can transfer heat with very high efficiency, and may include: heat pipes, thermal ground planes, vapor chambers, and thermosiphons, and the like.

In some embodiments, the present application provides two-phase cooling devices may include three substrates. In some embodiments, one or more of the substrates are formed from microfabricated metal, such as but not limited to titanium, aluminum, copper, or stainless-steel. In some embodiments the substrate may be formed as a thermal ground plane structure suitable for use in electronic devices. In some embodiments, the two-phase device may comprise a predetermined amount of a suitable working fluid, where the working fluid adsorbs or rejects heat by changing phases between liquid and vapor.

In some embodiments, the present application may provide two-phase cooling devices including a metal, such as but not limited to titanium, aluminum, copper, or stainless-steel, substrate comprising a plurality of etched microstructures, forming a wicking structure wherein one or more of the microstructures have a height of 1-1000 micrometers, a width of 1-1000 micrometers, and a spacing of 1-1000 micrometers. In some embodiments a vapor chamber may be in communication with the plurality of metal microstructures. In some embodiments at least one intermediate substrate may be in communication with the wicking structure and the vapor region. In some embodiments, a fluid may be contained within the wicking structure and vapor chamber for transporting thermal energy from one region of the thermal ground plane to another region of the thermal ground plane, wherein the fluid may be driven by capillary forces within the wicking structure.

In some embodiments, the cooling device can be configured for high capillary force in the wicking structure, to support large pressure differences between the liquid and vapor phases, while minimizing viscous losses of the liquid flowing in the wicking structure. In some embodiments, the cooling device may be a thermal ground plane which can be made very thin, and could possibly transfer more thermal energy than can be achieved by earlier TGP's. In some embodiments, different structural components could be located in an evaporator region, an adiabatic region and a condenser region. In some embodiments, an evaporator region may contain an intermediate substrate that comprises a plurality of microstructures that when mated with the wicking structure form high aspect ratio structures. In some embodiments, the intermediate substrate features are interleaved with the wicking structure features to increase the effective aspect ratio of the wicking structure. In some embodiments, an adiabatic region may contain an intermediate substrate positioned in close proximity to the wicking structure to separate the vapor in the vapor chamber from the liquid in the wicking structure. In some embodiments, a condenser region may contain an intermediate substrate that has large openings (compared to the microstructure) so that the wicking structure is in direct communication with the vapor chamber. In some embodiments, a condenser region might not contain an intermediate substrate so that the wicking structure is in direct communication with the vapor chamber.

BRIEF DESCRIPTION OF THE DRAWINGS

Various exemplary details are described with reference to the following figures, wherein.

Figure 1:
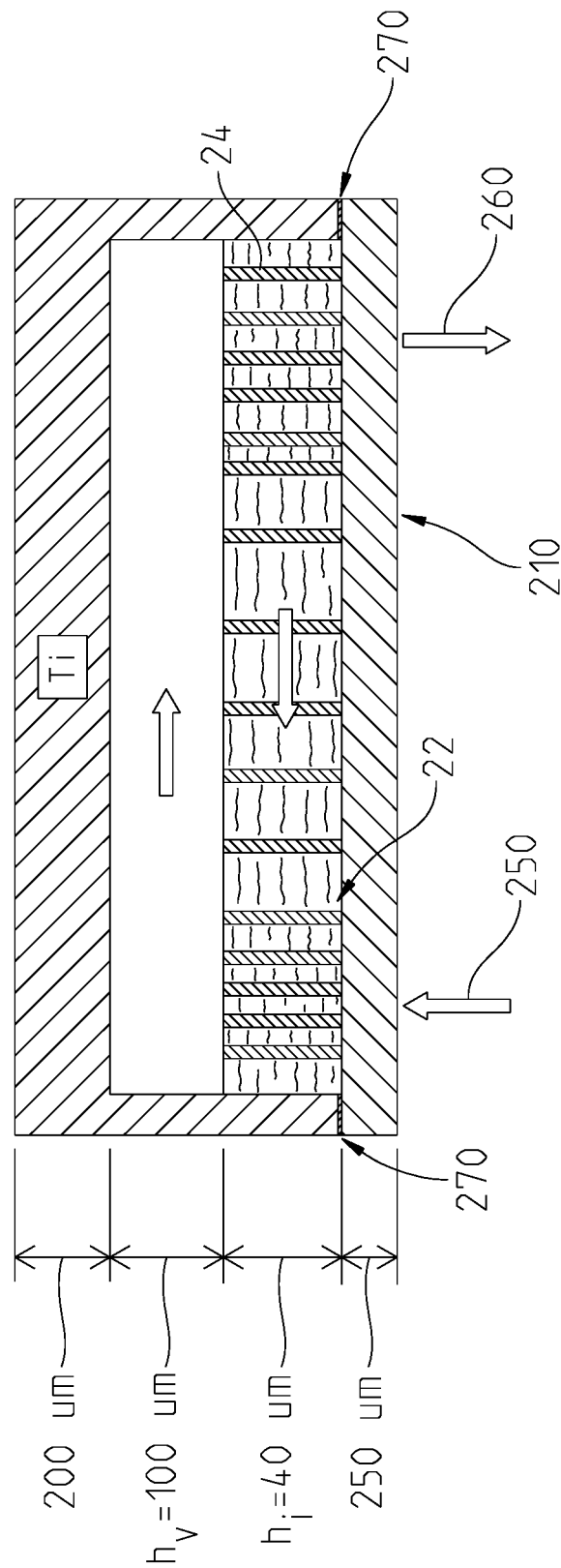
FIG. 1 is an illustrative embodiment of an earlier titanium-based thermal ground plane, comprising a titanium substrate with a wicking structure, a backplane, and a vapor chamber.
Figure 2A:
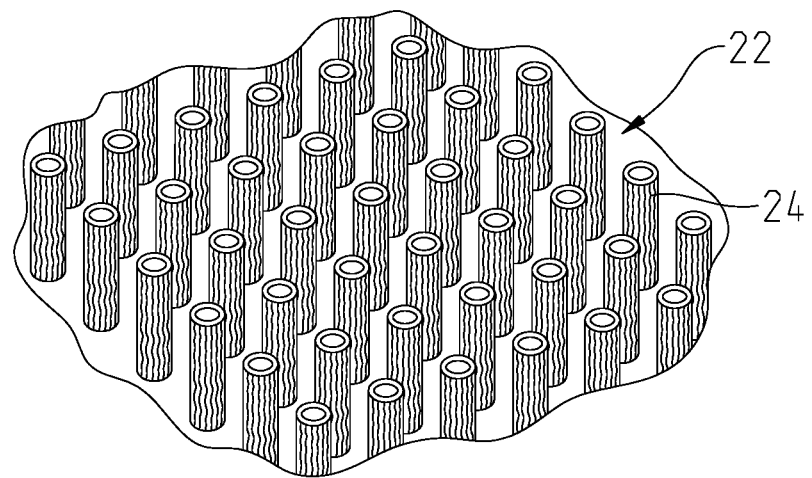
FIG. 2A is an illustrative embodiment of earlier titanium substrates with a wicking structure comprised of pillars.
Figure 2B:
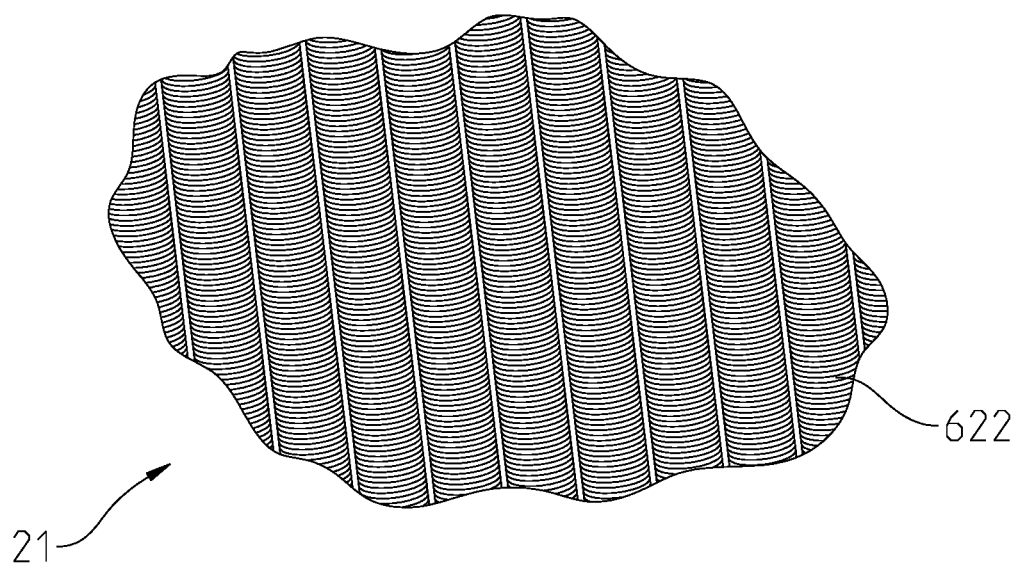
FIG. 2B is an illustrative embodiment of earlier titanium substrates with a wicking structure comprised of channels or grooves.

It should be understood that the drawings are not necessarily to scale.

DETAILED DESCRIPTION OF INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

In some embodiments, the thermal ground planes disclosed here could be used to provide efficient space utilization for cooling semiconductor devices in a large range of applications, including but not limited to aircraft, satellites, laptop computers, desktop computers, mobile devices, automobiles, motor vehicles, heating air conditioning and ventilation systems, and data centers.

Microfabricated substrates can be used to make more robust, shock resistant two-phase cooling devices, which may be in the form of Thermal Ground Planes (TGPs). Although a variety of materials for these substrates may be employed, as described in the incorporated references, metal, such as but not limited to titanium, aluminum, copper, or stainless-steel substrates have been found suitable for TGPs.

The choice of metal can depend upon the various applications and cost considerations. There are advantages to various metals. For example, copper offers the highest thermal conductivity of all the metals. Aluminum can be advantageous for applications where high thermal conductivity is important and weight might be important. Stainless steel could have advantageous in certain harsh environments.

Titanium has many advantages. For example, titanium has a high fracture toughness, can be microfabricated and micro-machined, can resist high temperatures, can resist harsh environments, and can be bio-compatible. In addition, titanium-based thermal ground planes can be made light weight, relatively thin, and have high heat transfer performance. Titanium can be pulse laser welded. Since titanium has a high fracture toughness, it can be formed into thin substrates that resist crack and defect propagation. Titanium has a relatively low coefficient of thermal expansion of approximately $8.6 \times 10-6/K$. The low coefficient of thermal expansion, coupled with thin substrates can help to substantially reduce stresses due to thermal mismatch. Titanium can be oxidized to form Nano Structured Titania (NST), which forms stable and super hydrophilic surfaces. In some embodiments, titanium (Ti) substrates with integrated Nano Structured Titania (NST) have been found suitable for TGP's.

Metals, such as but not limited to titanium, aluminum, copper, or stainless steel, can be microfabricated with controlled characteristic dimensions (depth, width, and spacing) ranging from 1-1000 micrometers, to engineer the wicking structure and intermediate substrate for optimal performance and customized for specific applications. In some embodiments, the controlled characteristic dimensions (depth, width, and spacing) could range from 10-500 micrometers, to engineer the wicking structure for optimal performance and customized for specific applications.

In some embodiments, titanium can be oxidized to form nanostructured titania (NST), which could provide super hydrophilic surfaces and thereby increase capillary forces, and enhance heat transfer. In some embodiments, the NST can be comprised of hair-like patterns with a nominal roughness of 200 nanometers (nm). In some embodiments, NST can have a nominal roughness of 1-1000 nm.

In some embodiments aluminum can be oxidized to form hydrophilic nanostructures, to provide super hydrophilic coatings. In some embodiments, sintered nanoparticles and/or microparticles could be used to provide super hydrophilic surfaces and thereby increase capillary forces, and enhance heat transfer. Such a wicking structure 22 is shown in FIG. 1.

In some embodiments, titanium can be coated on another type of substrate forming a titanium film. The titanium film can be oxidized to form nano-structured titania (NST), and thereby provide super hydrophilic surfaces.

Titanium is a material that can be microfabricated using cleanroom processing techniques, macro-machined in a machine shop, and hermetically packaged using a pulsed laser micro-welding technique. When the thermal ground plane is comprised of only titanium or titania as the structural material, the various components can be laser welded in place, without introducing contaminants, which could possibly produce non-condensable gasses, contribute to poor performance, and possibly lead to failure. In addition, titanium and titania have been shown to be compatible with water, which can contribute to long lifetimes and minimal non-condensable gas generation. Accordingly, the titanium substrate may be connected to the titanium backplane by a laser weld, to form a hermetically-sealed vapor chamber.

Metals can be bonded to form hermetic seals. In some embodiments, titanium substrates can be pulsed laser micro-welded together to form a hermetic seal 270. In other embodiments, copper, aluminum, and stainless-steel substrates could be welded using a variety of techniques, such as but not limited to, soldering, brazing, vacuum brazing, TIG, MIG, and many other well-known welding techniques.

The present application describes the fabrication of metal-based Thermal Ground Planes (TGPs). Without loss of generality, the present application discloses thermal ground plane embodiments that could be comprised of three or more metal substrates.

An embodiment can comprise of three substrates (of which one or more can be constructed using a metal, such as, but not limited to, titanium, aluminum, copper, or stainless-steel) to form a thermal ground plane. In some embodiments, titanium substrates could be used to form a thermal ground plane. In some embodiments, one substrate supports an integrated super-hydrophilic wicking structure 220, a second substrate consists of a deep-etched (or macro-machined) vapor chamber, and a third intermediate substrate 110 may consist of microstructures 112 and are in communication with the wicking structure 220 and the vapor chamber 300. The substrates could be laser micro-welded together to form the thermal ground plane.

The working fluid can be chosen based upon desired performance characteristics, operating temperature, material compatibility, or other desirable features. In some embodiments, and without loss of generality, water could be used as the working fluid. In some embodiments, and without loss of generality, helium, nitrogen, ammonia, high-temperature organics, mercury, acetone, methanol, Flutec PP2, ethanol, heptane, Flutec PP9, pentane, caesium, potassium, sodium, lithium, or other materials, could be used as the working fluid.

The current TGP can provide significant improvement over earlier titanium-based thermal ground planes. For example, the present invention could provide significantly higher heat transfer, thinner thermal ground planes, thermal ground planes that are less susceptible to the effects of gravity, and many other advantages.

The following co-pending and commonly-assigned U.S. patent applications are related to the instant application, and are incorporated by reference in their entirety: U.S. Pat. No. 7,718,552 B2, issued May 18, 2010, by Samah, et al, entitled "NANOSTRUCTURED TITANIA," which application is incorporated by reference herein. U.S. Patent Application Ser. No. 61/082,437, filed on Jul. 21, 2008, by Noel C. MacDonald et al., entitled "TITANIUM-BASED THERMAL GROUND PLANE," which application is incorporated by reference herein. U.S. patent application Ser. No. 13/685,579, filed on Nov. 26, 2012, by Payam Bozorgi et al., entitled "TITANIUM-BASED THERMAL GROUND PLANE," which application is incorporated by reference herein. PCT Application No. PCT/US2012/023303, filed on Jan. 31, 2012, by Payam Bozorgi and Noel C. MacDonald, entitled "USING MILLISECOND PULSED LASER WELDING IN MEMS PACKAGING," which application is incorporated by reference herein. U.S. Patent Provisional Application Ser. No. 62/017,455, filed on Jun. 26, 2014, by Payam Bozorgi and Carl Meinhart, entitled "TWO-PHASE COOLING DEVICES WITH LOW-PROFILE CHARGING PORTS" which application is incorporated by reference herein.

FIG. 1 illustrates a thermal ground plane, which in some embodiments may be a titanium-based thermal ground plane, comprising a titanium substrate with a wicking structure, a backplane, and a vapor chamber described in the incorporated references. The device may be pulsed micro-welded to form a hermetic seal. The thermal ground plane can be charged with a working fluid, such as water in a thermodynamically saturated state, where the liquid phase resides predominantly in the wicking structure, and the vapor phase resides predominantly in the vapor chamber.

FIG. 1 illustrates a thermal ground plane, which in some embodiments may be a titanium-based thermal ground plane, comprising a titanium substrate with a wicking structure, a backplane, and a vapor chamber described in the incorporated references. The device may be pulsed micro-welded to form a hermetic seal. The thermal ground plane can be charged with a working fluid, such as water in a thermodynamically saturated state, where the liquid phase resides predominantly in the wicking structure, and the vapor phase resides predominantly in the vapor chamber.

Figure 3A:
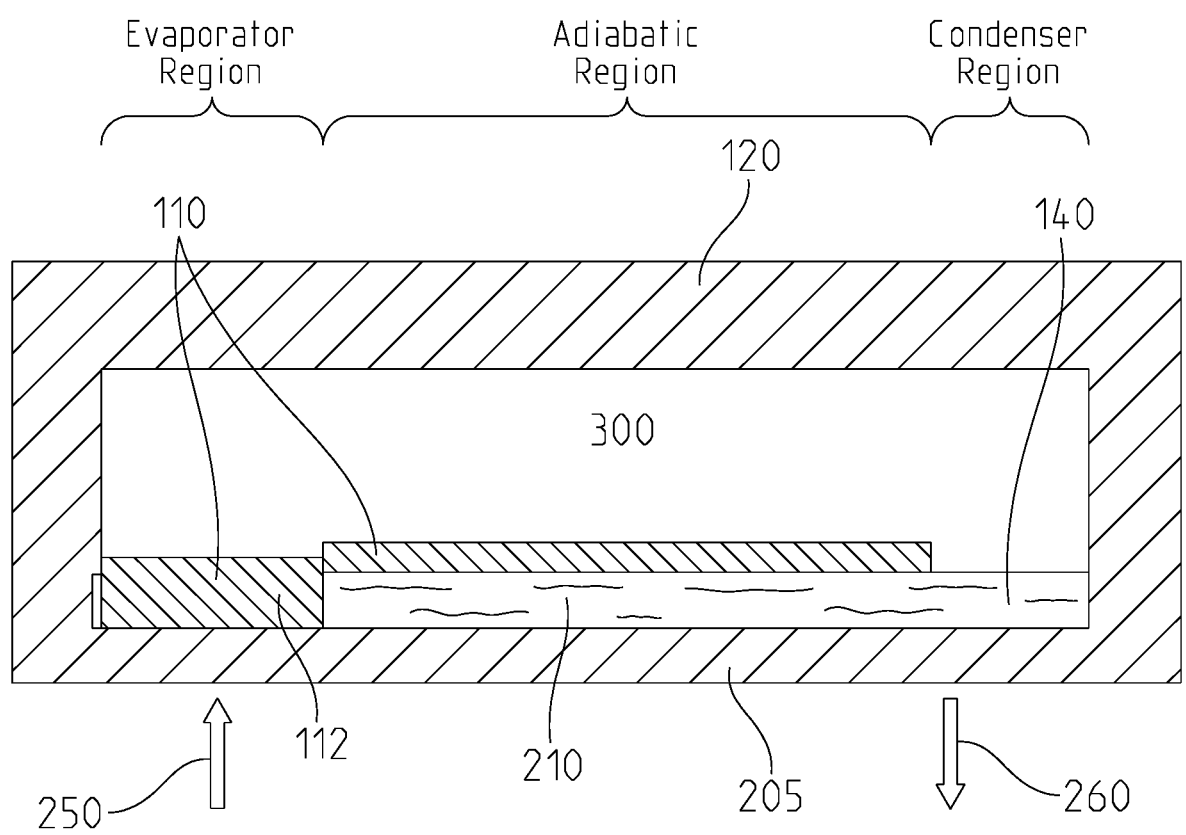
FIG. 3A is an illustrative embodiment of a metal-based thermal ground plane with an intermediate substrate in communication with a wicking structure and a vapor chamber showing a profile view depicting components of an embodiment.
Figure 3B:
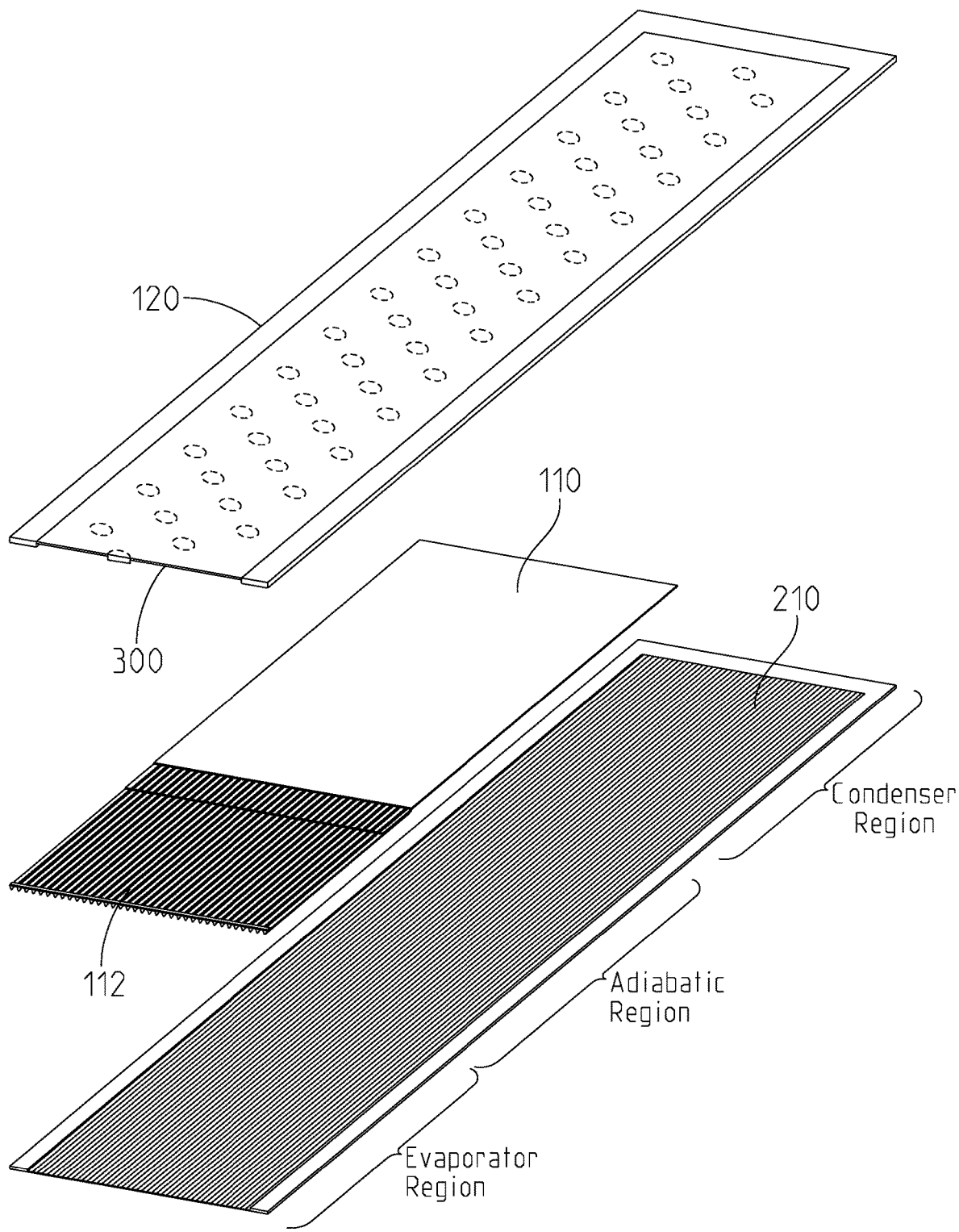
FIG. 3B is an exploded view of a structural components of an embodiment.

FIG. 3 illustrates an embodiment of a novel metal-based thermal ground plane with an intermediate substrate 110 in communication with a wicking structure 220 and a vapor chamber 300. The intermediate layer could comprise microstructures 112. FIG. 3(A) shows a profile view depicting components of an embodiment, while FIG. 3(B) shows an exploded view of structural components of an embodiment. The metal substrate 210 could be bonded to a metal backplane 120 to form a hermetically-sealed vapor chamber 300. The vapor chamber 300 may therefore be enclosed by the metal substrate 210 and the metal backplane 120. For example, in an embodiment, a titanium substrate could be pulsed laser micro-welded to a titanium backplane 120 to form a hermetically sealed vapor chamber.

In some embodiments, a plurality of intermediate substrates 110 could be used, where at least one different intermediate substrate 110 could be used for each different region of the thermal ground plane. The plurality of intermediate substrates 110 could be positioned in close proximity to each other to collectively provide overall benefit to the functionality of the thermal ground plane.

In some embodiments, the intermediate substrate 110 could contain regions that are comprised of a plurality of microstructures 112, with characteristic dimensions (depth, width, and spacing) ranging from 1-1000 micrometers. Some areas of the ground plane may include pillars 24 to enhance wicking within the wicking structure 22. In some embodiments, the intermediate substrate 110 could contain regions that are comprised of a plurality of microstructures 112, with dimensions (depth, width, and spacing) ranging from 10-500 micrometers.

The at least one intermediate substrate 110 may contain regions that are comprised of a plurality of microstructures 112, regions that are comprised of solid substrates, and regions that are comprised of at least one opening in the at least one intermediate substrate 110 (that is large compared to the microstructures 112, and for example openings could range in dimension of 1 millimeter-100 millimeters, or 1 millimeter-1000 millimeters.

In some embodiments, the opening in the intermediate substrate 110 for chosen regions of the thermal ground plane could be achieved by simply not providing an intermediate substrate 110 in those regions. Thermal energy can be supplied by a heat source 250 and removed by a heat sink 260. Thermal energy can be transferred from one region (evaporator region) of the metal substrate 210 to another region (condenser region) of the metal substrate 210. In the evaporator region, the local temperature is higher than the saturation temperature of the liquid/vapor mixture, causing the liquid 140 to evaporate into vapor, thereby absorbing thermal energy due to the latent heat of vaporization.

The vapor residing in the vapor chamber 300 can flow from the evaporator region through the adiabatic region to the condenser region. The heat sink 260 could absorb heat from the condenser region causing the local temperature to be lower than the saturation temperature of the liquid/vapor mixture, causing the vapor to condense into the liquid phase, and thereby releasing thermal energy due to the latent heat of vaporization.

The condensed liquid 140 could predominantly reside in the wicking structure 220 and could flow from the condenser region through the adiabatic region to the evaporator region as a result of capillary forces.

As a result, it could be advantageous for high-performance heat pipes to: (1) exhibit minimal viscous losses for the liquid 140 flowing through the wicking structure 220, and to (2) exhibit maximal capillary forces in the evaporator region. In many practical thermal ground plane embodiments, minimal viscous losses and maximal capillary forces are difficult to achieve simultaneously. Introducing an intermediate substrate 110 with a plurality of microstructures 112, configured as appropriate in each of the three regions could provide a means in which the thermal ground plane could have reduced viscous losses in some regions, while exhibiting increased capillary forces in other regions, compared to earlier TGP's with more or less the same structure over a majority of the interior.

In some embodiments, supporting pillars (standoffs) are used to mechanically support the spacing between the backplane 120 and the wicking structure 220 and/or intermediate substrate 110. In some embodiments, the supporting pillars (standoffs) provide controlled spacing for the vapor chamber 300. The supporting pillars (standoffs) could be microfabricated using chemical wet etching techniques or other fabrication techniques (as described above). Accordingly, the backplane may include standoffs that are in communication with the intermediate substrate and/or the metal substrate, for structurally supporting the thermal ground plane.

FIG. 4 depicts structural components of an embodiment where the different structural components are located in an evaporator region, an adiabatic region, and a condenser region: (A) shows an evaporator region of an embodiment where the intermediate substrate 110 comprises a plurality of microstructures 112 that are positioned to increase the effective aspect ratio of the wicking structure 220. The fingers (microstructures 112) from the intermediate substrate 110 are interleaved with channels in the wicking structure 220, thereby creating double the number of higher aspect ratio features, compared to the lower aspect ratio features of the wicking structure 220 without the intermediate substrate 110. The term interleaved should be considered to mean that the microstructures 112 occupy the interstitials between channels in the wicking structure 220. (B) shows an adiabatic region of an embodiment where the intermediate substrate 110 is positioned in close proximity to the wicking structure 220, and (C) shows a condenser region of an embodiment, where the wicking structure 220 is in direct communication with the vapor chamber 300. (D) shows the intermediate substrate 110 as a whole.

Accordingly, the thermal ground plane may have an evaporator region, an adiabatic region, and a condenser region. The intermediate substrate, in turn, may have a different topography in the different regions, and in particular in the evaporator region relative to an adiabatic region.

Figure 4A:
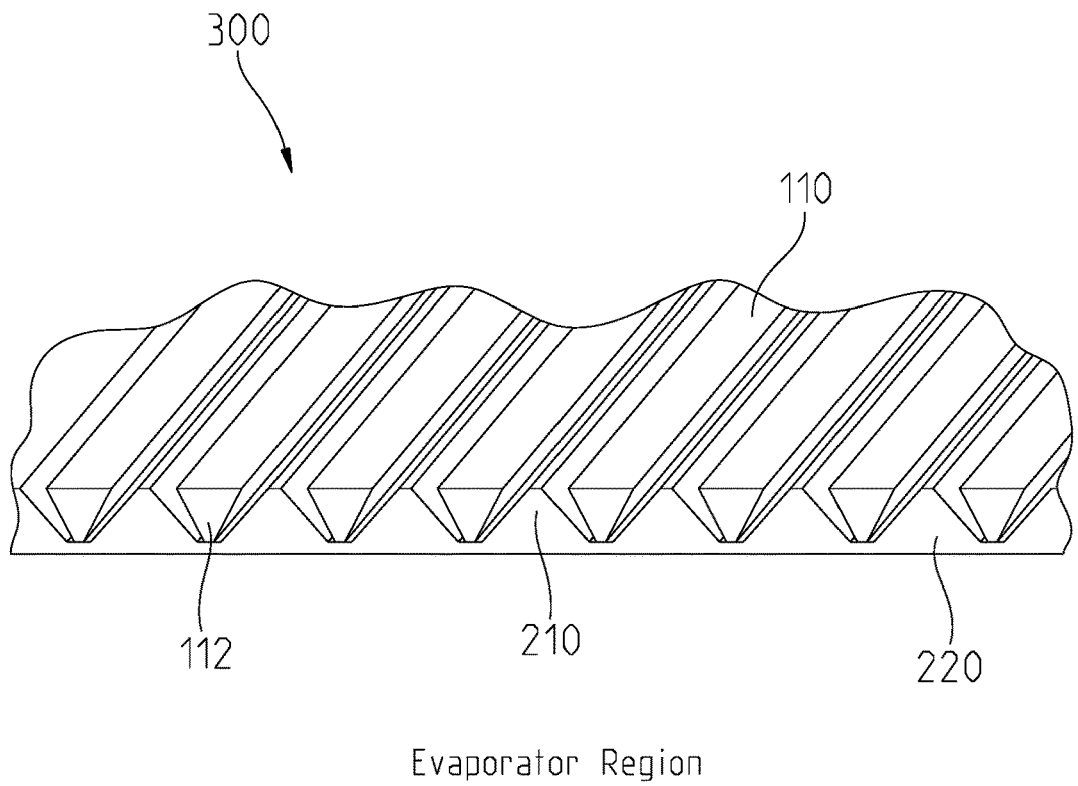
FIG. 4A shows an illustrative embodiment of an evaporator region where the intermediate substrate comprises a plurality of microstructures that are interleaved with the wicking structure.

FIG. 4(A) depicts an embodiment where the intermediate substrate 110 comprises a plurality of microstructures 112 that are interleaved with the wicking structure 220 of the metal substrate 210. By interleaving the microstructures 112 of the intermediate region with the wicking structure 220 of the metal substrate 210, the interface between the solid and liquid can be substantially increased. This could increase the capillary forces that are applied to the liquid, and could increase the amount of heat transferred from the metal solid to the liquid.

Figure 4B:
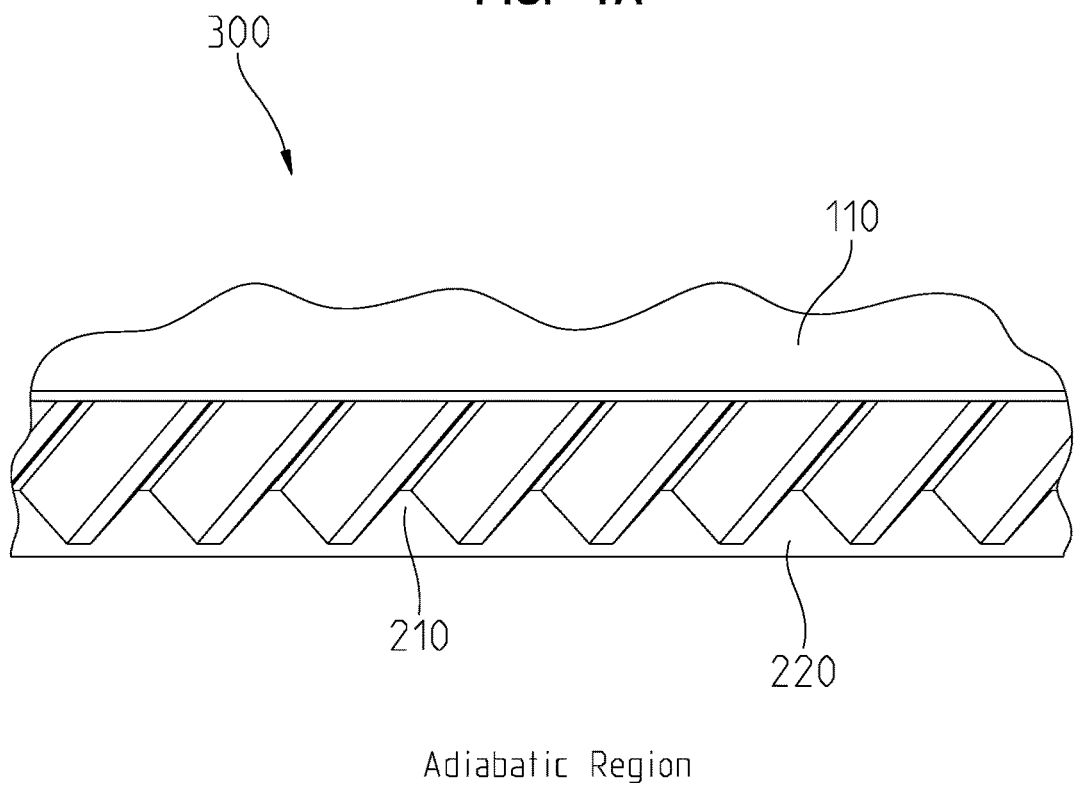
FIG. 4B shows an adiabatic region of an embodiment where the intermediate substrate is positioned in close proximity to the wicking.

FIG. 4(B) shows an adiabatic region of an embodiment where the intermediate substrate 110 is positioned in close proximity to the wicking structure 220. A solid intermediate substrate 110 could be used to isolate the vapor chamber 300 from the wicking structure 220. By isolating the vapor chamber 300 from the wicking structure 220, the solid-liquid interface area could be increased, and the liquid could fill substantially the wicking structure 220, without a meniscus occupying the channel, and which could provide a higher mass flow rate for the liquid with less viscous pressure drop, compared to the earlier TGP's where the liquid in the wicking structure 220 could be exposed directly to the vapor in the vapor chamber 300 with a meniscus residing at the liquid/vapor interface.

Figure 4C:
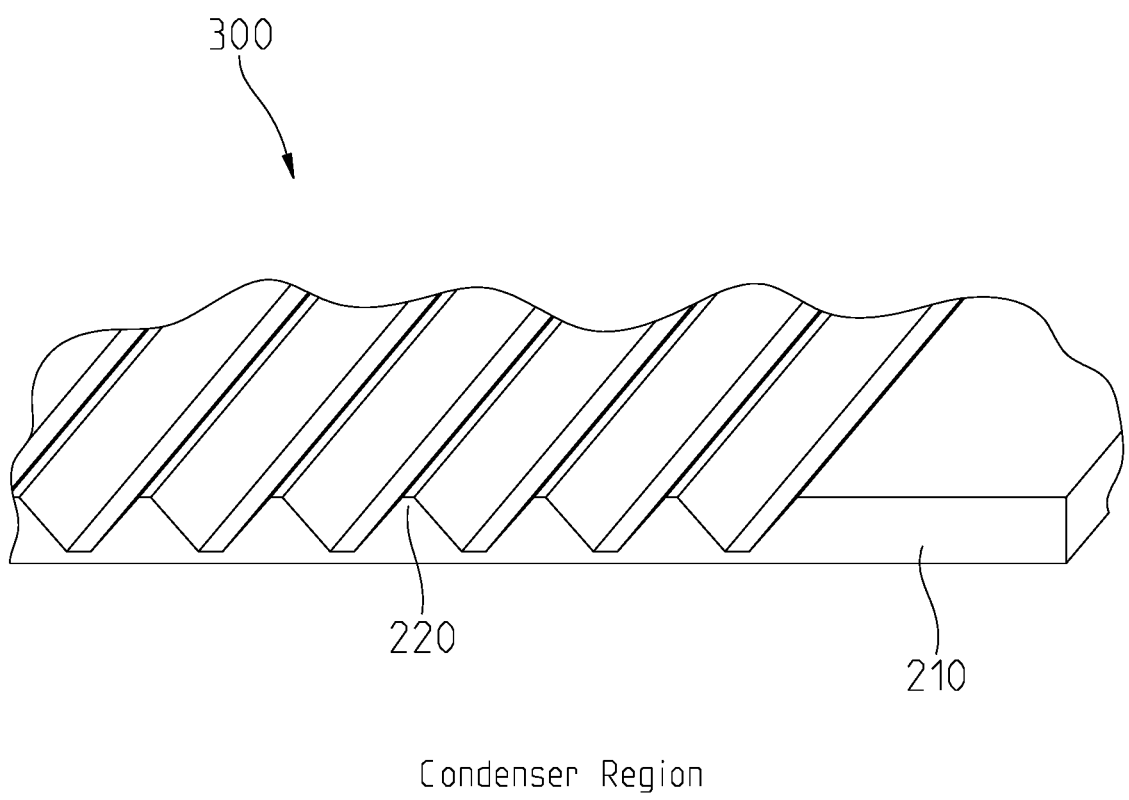
FIG. 4C shows a condenser region of an embodiment where the wicking structure is in direct communication with the vapor chamber.
Figure 4D:
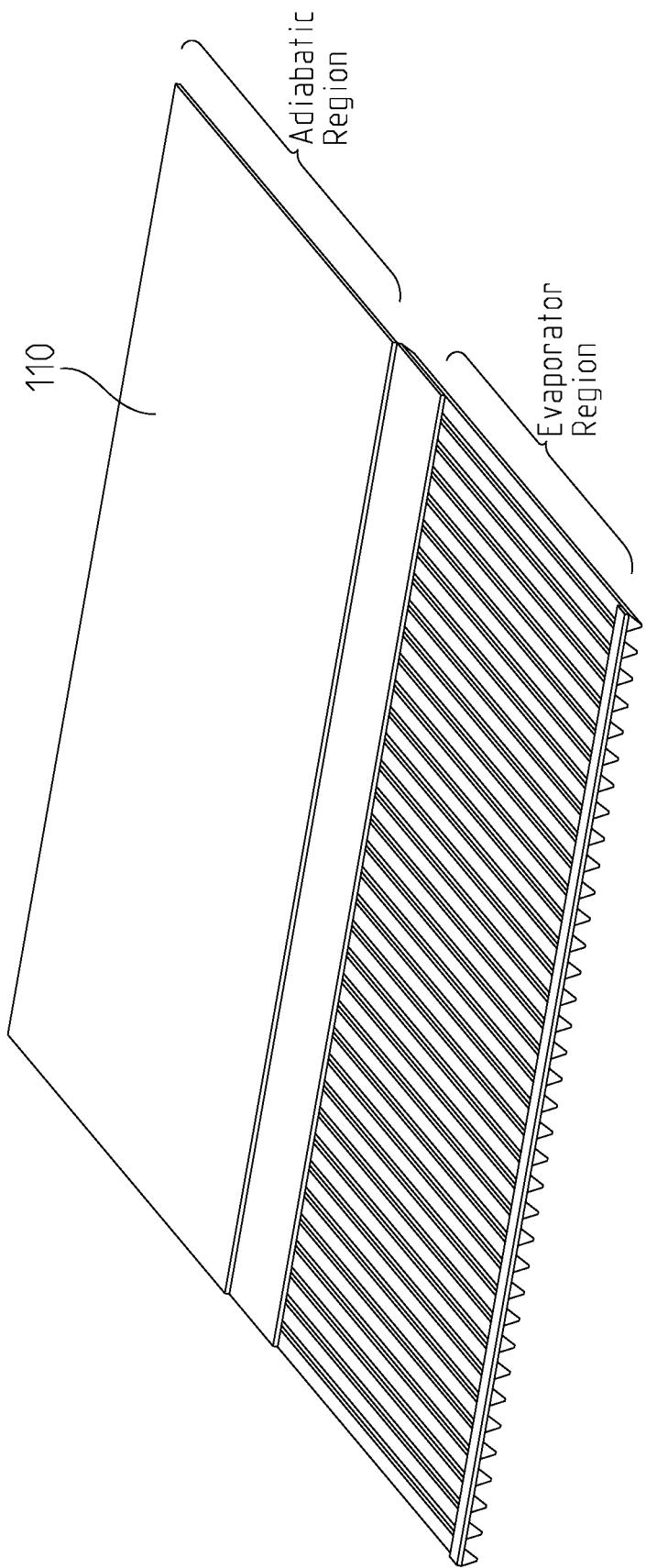
FIG. 4D shows detail of an embodiment of an intermediate substrate.

FIG. 4(C) shows a condenser region of an embodiment where the wicking structure 220 is in direct communication with the vapor chamber 300. When the wicking structure 220 is in direct communication with the vapor chamber 300, vapor could more easily condense onto the wicking structure 220. Furthermore, in regions, such as the condenser, there might not be significant differences in pressure between the liquid and vapor phases, and an intermediate substrate 110 may not provide significant advantages.

However, in other embodiments, if the condenser region was relatively large and there was significant pressure difference between the liquid and vapor phases, an intermediate substrate 110 could provide advantages in the condenser region as well.

FIG. 4 (D) shows an illustrative embodiment of an implementation of an intermediate substrate 110 as described above. The evaporator region of the intermediate substrate 110 includes rows of wedge-shaped fingers supported across each end, such that when the TGP is assembled, the fingers interleave with the substrate wicking microstructures 112 as shown in FIG. 4(A), where the interleaved structures are exposed to the vapor chamber 300. The adiabatic region of the intermediate substrate 110 is a cover that overlays a portion of the wicking microstructures 112, as shown in FIG. 4(B). The condenser region may not require an intermediate substrate 110 component in some embodiments, as shown in FIG. 4(C).

FIG. 4 (D) shows an illustrative embodiment of an implementation of an intermediate substrate 110 as described above. The evaporator region of the intermediate substrate 110 includes rows of wedge-shaped fingers supported across each end, such that when the TGP is assembled, the fingers interleave with the substrate wicking microstructures 112 as shown in FIG. 4(A), where the interleaved structures are exposed to the vapor chamber 300. The adiabatic region of the intermediate substrate 110 is a cover that overlays a portion of the wicking microstructures 112, as shown in FIG. 4(B). The condenser region may not require an intermediate substrate 110 component in some embodiments, as shown in FIG. 4(C).

FIG. 4 (D) shows an illustrative embodiment of an implementation of an intermediate substrate 110 as described above. The evaporator region of the intermediate substrate 110 includes rows of wedge-shaped fingers supported across each end, such that when the TGP is assembled, the fingers interleave with the substrate wicking microstructures 112 as shown in FIG. 4(A), where the interleaved structures are exposed to the vapor chamber 300. The adiabatic region of the intermediate substrate 110 is a cover that overlays a portion of the wicking microstructures 112, as shown in FIG. 4(B). The condenser region may not require an intermediate substrate 110 component in some embodiments, as shown in FIG. 4(C).

Thus, the addition of the intermediate substrate 110 allows for optimization of the wicking structure 220 in each of the three operational regions of the cooling device, and in a way that could be compatible with micromachining processes, such as wet etching techniques, and assembly techniques.

Without loss of generality, the wicking structure 220 could be formed by dry etching, wet chemical etching, other forms of micromachining, macromachining, sawing with a dicing saw, and many other types of processes. In some embodiments, dry etching could provide high aspect ratio channels, where the depth is comparable or perhaps even larger than the width of the channels. However, dry etching may be limited to smaller regions and may not be desirable for large-scale manufacturing, compared to wet etching processes. Mask-based wet etching could be desirable as it could be applicable to relatively large etch regions, could be cost effective, and could be compatible with high-volume manufacturing. In some embodiments, photolithography-based methods could be used to dry or wet etching.

In some embodiments the wicking structure 220 could be formed by standard wet chemical etching techniques. In some embodiments, wet chemical etching can limit the aspect ratio, which is the ratio of the wicking channel depth to the wicking channel width. In some embodiments that use wet etching, the wicking channel width can be at least 2 to 2.5 times wider than the wicking channel etch depth. In some embodiments, where the wicking channel width is at least 2 to 2.5 times wider than the wicking channel etch depth, there could be significant disadvantages to low aspect ratio wicking channels.

The pressure between the vapor and liquid phases can be described by the Laplace pressure, $P=Pv-Pl=2/R$, where $Pv$ is the vapor pressure, $Pl$ is the liquid pressure, is the surface tension, and $R$ is the radius of curvature of the surface. A high-pressure difference between the liquid and vapor phases could be obtained by decreasing the radius of curvature, $R$.

Generally, a smaller radius of curvature can be achieved by having material surfaces that exhibit low contact angles, and by forming geometries with relatively small geometric dimensions. In many embodiments, it may be desirable to have low viscous losses for the liquid flowing through the wicking structure 220. Small geometric dimensions in the wicking structure 220 can significantly increase the viscous losses of liquid flowing through the wicking structure 220. Therefore, in some embodiments, it may be difficult to achieve low viscous losses, and have a meniscus with a small radius of curvature that can support a high-pressure difference between the vapor and liquid phases. The current application discloses a means in which some embodiments can be configured for maximum capillary forces, support large pressure differences between the liquid and vapor phases, for example in the evaporator region. The current application discloses a means in which some embodiments can be configured to minimize viscous losses of the liquid flowing in the wicking structure 220, by using different structures in the different regions.

FIG. 5 shows profile views of structural components of an illustrative embodiment where the structures are non-wetted (i.e. dry) and are wetted by a liquid: (A) non-wetted structural components in the evaporator region, (B) wetted structural components in the evaporator region, (C) non-wetted structural components in the adiabatic region, (D) wetted structural components in the adiabatic region, (E) non-wetted structural components in the condenser region, (F) wetted structural components in the condenser region.

Figure 5A:
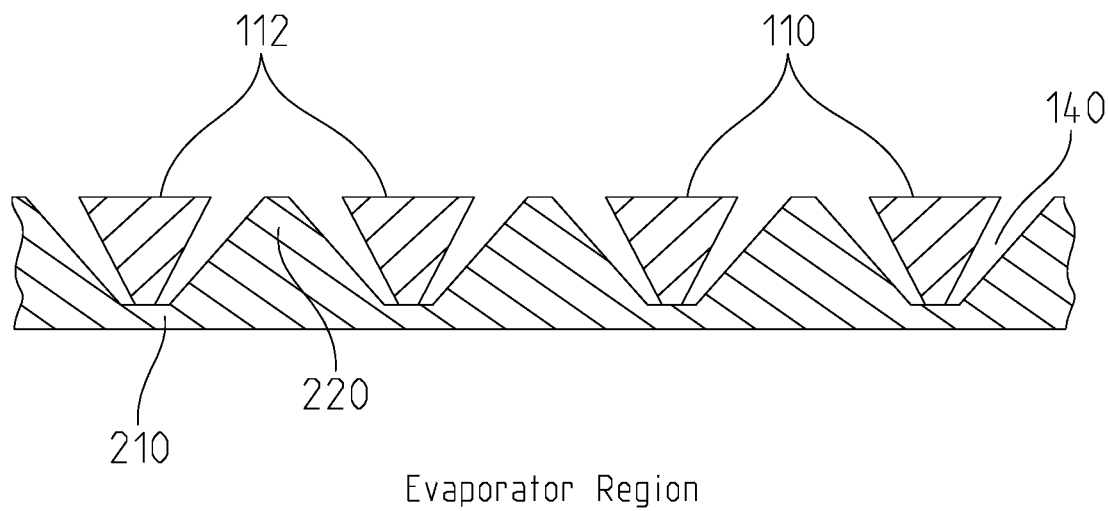
FIG. 5A is an illustrative embodiment of a profile view of a non-wetted structural component in the evaporator region.

FIG. 5(A) shows a profile view of an illustrative embodiment where the intermediate substrate 110 comprises a plurality of microstructures 112 that are interleaved with the wicking structure 220 of the metal substrate 210.

Figure 5B:
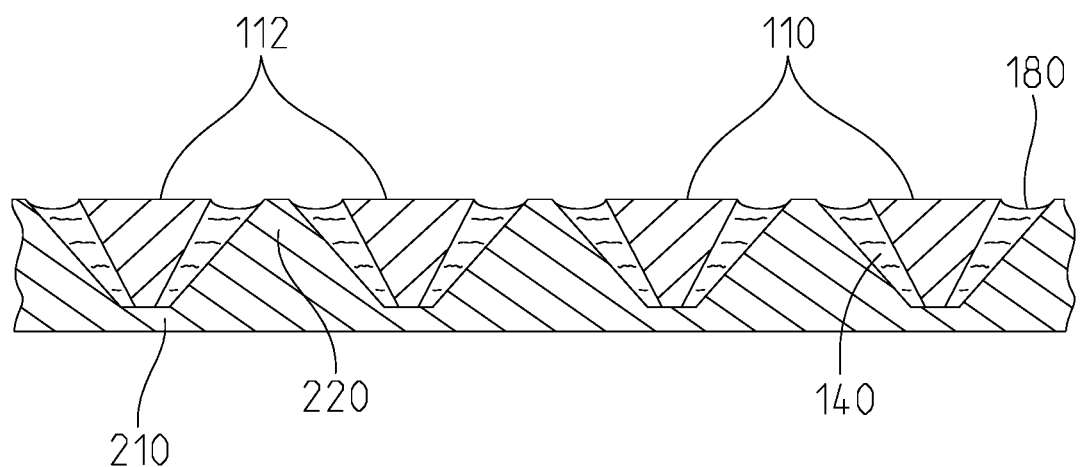
FIG. 5B is an illustrative embodiment of a profile view of a wetted structural component in the evaporator region.

FIG. 5(B) shows a profile view of an illustrative embodiment where the intermediate substrate 110 comprises a plurality of microstructures 112 that are interleaved with the wicking structure 220 of the metal substrate 210, and where the microstructures 112 and wicking structure 220 are wetted by a liquid 140.

By interleaving the microstructures 112 of the intermediate substrate 110 with the wicking structure 220 of the metal substrate 210, the interface area between the solid and liquid 140 could be substantially increased. This could increase the capillary forces that are applied to liquid 140, and could increase the amount of heat transferred from the metal solid to liquid 140.

FIG. 5(B) shows the meniscus 180 at the liquid-vapor interface. In some embodiments, gaps between the plurality of microstructures 112 contained in the intermediate substrate 110 and the wicking structure 220 could be formed so that they are substantially smaller than the depth of the wicking structure 220. In some embodiments the relatively small gaps between the plurality of microstructures 112 contained in the intermediate substrate 110 and the wicking structure 220 could provide effectively higher aspect ratio wicking channels, compared to some embodiments where the wicking structure 220 is formed by wet etching a single metal substrate 210 (as is common, and depicted in FIG. 4(C)).

In some embodiments, titanium could be used as a substrate material. The thermal conductivity of titanium is approximately kTi=20 W/(m K), and liquid water is approximately, kW=0.6 W/(m K). Since the thermal conductivity of titanium is approximately 30 times higher than liquid water, the intermediate substrate 110 can provide additional thermal conduction pathways, which can decrease the thermal resistance between the outside surface of the thermal ground plane and liquid 140 located in the wicking structure 220. Furthermore, the microstructures 112 contained within the intermediate substrate 110 could increase the solid-liquid interface area, which could decrease the thermal resistance, and increase the critical heat flux that can occur, between titanium solid and liquid 140.

In some embodiments, the combination of the wicking structure 220 and the intermediate substrate 110 can effectively increase the aspect ratio of the channels in the wicking structure 220. Under very large pressure differences between the liquid and vapor phases, the meniscus 180 may be pushed down and not wet the top of the wicking structure 220. However, in some embodiments, the shape of the composite wicking structure 220 formed by interleaving the microstructures 112 of the intermediate substrate 110 with the wicking structure 220 may be chosen such that under large pressure differences across the meniscus 180, there is only partial dry out (or at least dry out could be substantially delayed) of the wicking structure 220 (so that the TGP continues to function), and the thermal ground plane does not undergo catastrophic dry out.

In previous two-phase heat transfer devices, instabilities can occur due to evaporation and/or boiling as the liquid phase is converted to the vapor phase. These instabilities can cause local dry out of the wicking structure 220 and can degrade the performance of the thermal ground plane. These instabilities can be substantially decreased in some of the current embodiments. For example, in some embodiments, the shape of the wicking structure 220 formed by interleaving the microstructures 112 of the intermediate substrate 110 with the wicking structure 220 may be chosen such that there can be substantial viscous resistance to liquid flow in the wicking structure 220. This viscous resistance can be advantageous as it can increase the stability of the evaporation and/or boiling process that may occur in the evaporator.

Figure 5C:
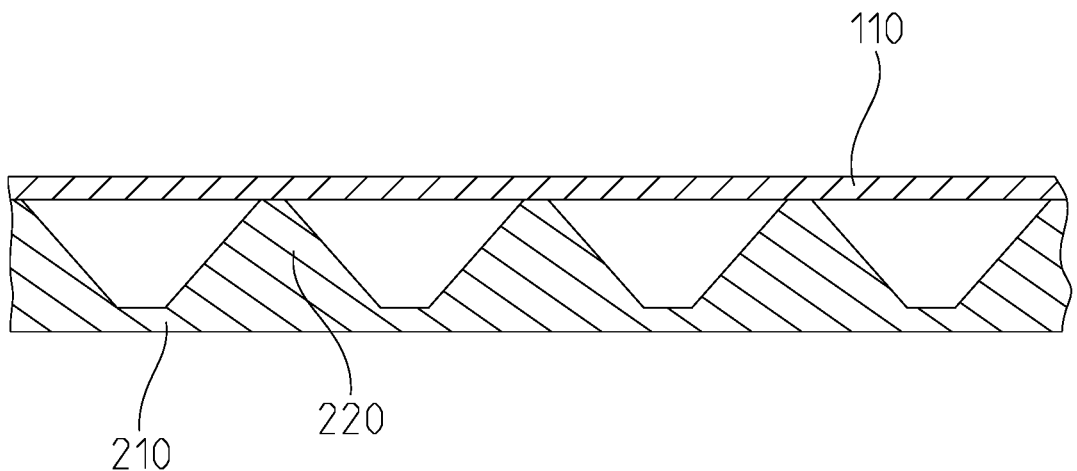
FIG. 5C is an illustrative embodiment of a profile view of a non-wetted structural component in the adiabatic region.

FIG. 5(C) shows a profile view an adiabatic region of an illustrative embodiment, where the intermediate substrate 110 is positioned in close proximity to the wicking structure 220. In some embodiments, the intermediate substrate 110 could be placed directly above the wicking structure 220. In some embodiments, the intermediate substrate 110 could be comprised of microstructures 112. In some embodiments, a solid intermediate substrate 110 could be used to isolate the vapor chamber 300 from the wicking structure 220. By isolating the vapor chamber 300 from the wicking structure 220, the solid-liquid interface area could be increased, and the liquid 140 could substantially fill the wicking structure 220, which could provide a higher mass flow rate of the liquid with less viscous pressure drop, compared to earlier wicking structures 220.

Figure 5D:
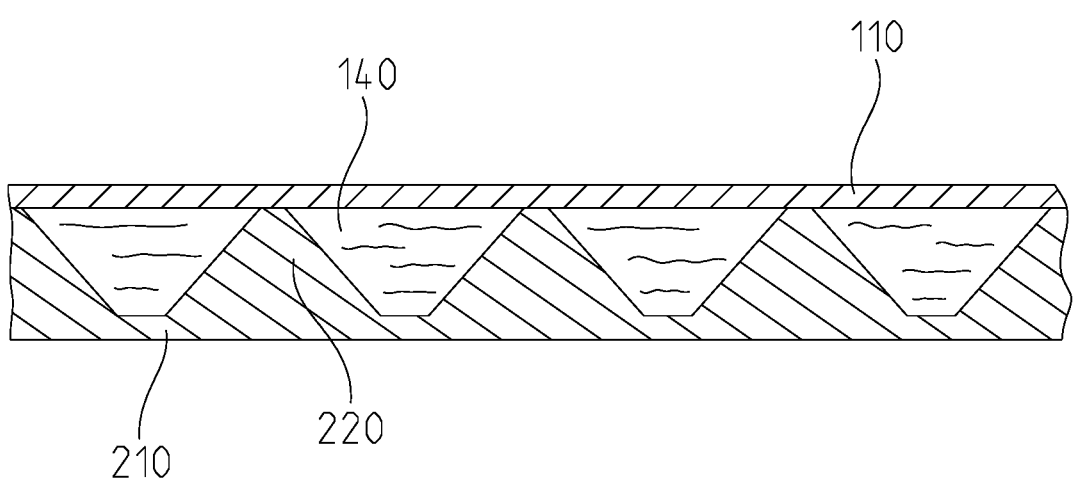
FIG. 5D is an illustrative embodiment of a profile view of a wetted structural component in the adiabatic region.

FIG. 5(D) shows a profile view an adiabatic region of an illustrative embodiment, where the intermediate substrate 110 is positioned in close proximity to the wicking, and where liquid 140 is wetted in the wicking structure 220. A solid intermediate substrate 110 could be used to isolate the vapor chamber 300 from the wicking structure 220. By isolating the vapor chamber 300 from the wicking structure 220, the solid-liquid interface area could be increased, and the liquid 140 could fill substantially the wicking structure 220, which could provide a higher mass flow rate for the liquid with less viscous pressure drop, compared to earlier wicking structures 220.

In some embodiments, where high-performance thermal energy transfer is desired, it may be important to decrease viscous losses of the liquid in the adiabatic region. In some embodiments, an intermediate substrate 110 could be used to isolate the vapor chamber 300 from the liquid 140 in the wicking structure 220. In some embodiments, where there is a large difference in pressure between the vapor and the liquid in the wicking structure 220, the vapor chamber 300 can be isolated from the liquid in the wicking structure 220 by a solid intermediate substrate 110, which could prevent the high difference in pressure from negatively affecting flow liquid in the wicking structure 220.

In some embodiments, where high-performance thermal energy transfer is desired, it may be important to decrease viscous losses of the liquid in the adiabatic region. In some embodiments, an intermediate substrate 110 could be used to isolate the vapor chamber 300 from the liquid 140 in the wicking structure 220. In some embodiments, where there is a large difference in pressure between the vapor and the liquid in the wicking structure 220, the vapor chamber 300 can be isolated from the liquid in the wicking structure 220 by a solid intermediate substrate 110, which could prevent the high difference in pressure from negatively affecting flow liquid in the wicking structure 220.

Figure 5E:
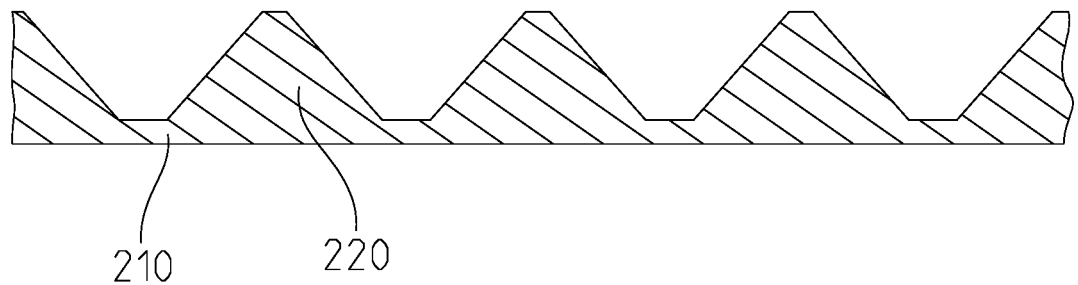
FIG. 5E is an illustrative embodiment of a profile view of a non-wetted structural component in the condenser region.

FIG. 5(E) shows a profile view of a condenser region of an illustrative embodiment, where the wicking structure 220 is in direct communication with the vapor chamber 300. When the wicking structure 220 is in direct communication with the vapor chamber 300, vapor could condense more readily onto the wicking structure 220. Furthermore, in regions, such as the condenser, there might not be significant differences in pressure between the liquid and vapor phases, and an intermediate substrate 110 may not provide significant advantages. However, for a case where the condenser region is large, significant differences in pressure between the liquid phase and the vapor phase could exist and accordingly, the condenser region could conceivably benefit from at least one intermediate substrate 110 with microstructures 112, whose effect is to increase the aspect ratio of the wicking structure 220, thereby shortening the meniscus 180 length and thus increasing the amount of pressure that the meniscus 180 can support, as described above for the evaporation region.

Figure 5F:
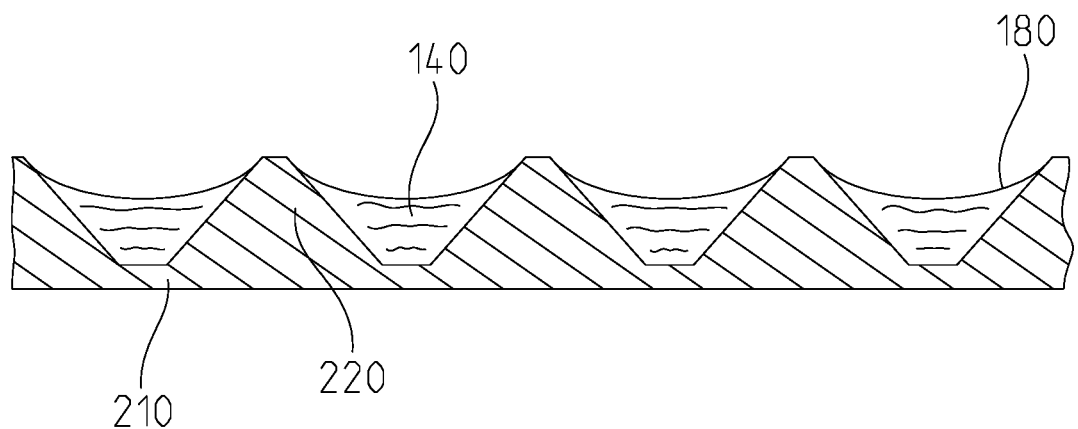
FIG. 5F is an illustrative embodiment of a profile view of a wetted structural component in the condenser region.

FIG. 5(F) shows a profile view of a condenser region of an illustrative embodiment, where the wicking structure 220 is in direct communication with the vapor chamber 300, where the wicking structure 220 is wetted by a liquid 140. In some embodiments, there may not be a significant difference in pressure between the vapor chamber 300 and the liquid 140 in the wicking structure 220, and an intermediate substrate 110 may not provide significant advantages. However, for a case where the condenser region is large, a significant pressure difference between the liquid phase and the vapor phase could exist and accordingly, the condenser region could conceivably benefit from microstructures 112 whose effect is to increase the aspect ratio of the wicking structure 220 and increase the amount of pressure that the meniscus 180 can support, as described above for the evaporation region.

Figure 6:
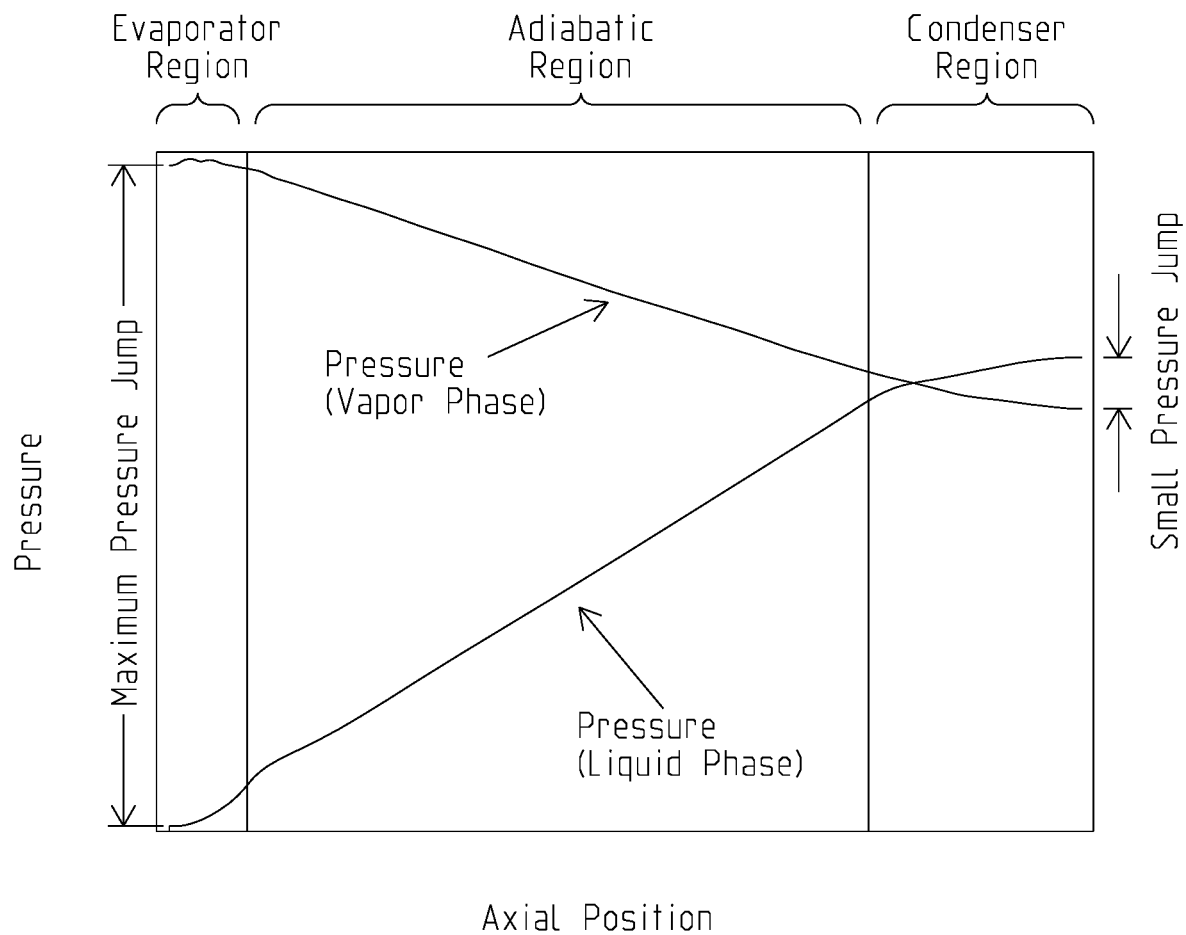
FIG. 6 shows pressure profiles as a function of axial location for an illustrative embodiment of a thermal ground plane. The curves show the pressure of the vapor phase in the vapor chamber and the liquid phase in the wicking structure. In this case, the maximum pressure difference between the liquid and vapor phases occurs in the evaporator region. The minimum pressure difference between the vapor and liquid phases occurs in the condenser region.

FIG. 6 shows pressure profiles as a function of axial location for an illustrative embodiment of a thermal ground plane. The curves show the pressure of the vapor phase in the vapor chamber 300 and the liquid phase in the wicking structure 220. In an illustrative embodiment, the maximum pressure difference between the liquid and vapor phases could occur in the evaporator region. In an illustrative embodiment, the minimum pressure difference between the vapor and liquid phases could occur in the condenser region.

Wicking structures 220 may be comprised of channels, pillars, or other structures. If these structures are formed by wet etching or other fabrication processes, they may be comprised of features with low aspect ratios. Earlier wicking structures 220 could be comprised of low-aspect ratio channels or pillars, and did not include an intermediate structure. In these earlier low-aspect ratio wicking structures 220, a large pressure difference between the liquid phase and the vapor phase could cause the meniscus 180 between the two phases to extend towards the bottom of the channel, thereby decreasing the amount of liquid 140 occupying the channel and significantly decreasing the mass flow of the liquid. This in turn could cause poor heat transfer performance and possible dry out of the wicking structure 220.

As shown in FIG. 6, the highest vapor pressure typically occurs in the evaporator region, and the vapor pressure, due to viscous losses, increases with the amount of heat transferred by the TGP. Further, it may be desirable to make the overall thickness of the thermal ground plane as thin as practically possible, which might be accomplished by making the vapor chamber 300 relatively thin. A relatively thin vapor chamber 300 could cause substantial viscous losses of the vapor flowing in the vapor chamber 300 from the evaporator through the adiabatic region to the condenser. High viscous losses of vapor flowing in the vapor chamber 300 can also contribute to a large difference in pressure between the liquid and vapor phases in the evaporator. An intermediate substrate 110 structure, which increases the aspect ratio of the wicking structure 220, as described above, has the effect of decreasing the meniscus 180 length of the liquid/vapor interface, making the radius of curvature smaller, in this part of the wicking structure 220, thereby making the meniscus 180 more resistant to high meniscus 180 pressure (FIG. 5(B)) and making the TGP capable of supporting much higher pressures than previous implementations while minimizing viscous losses. Accordingly, the region of the intermediate substrate may have a plurality of microstructures that are interleaved with at least one region of the wicking structure to form high aspect ratio wicking structures, in at least one region of the thermal ground plane. Furthermore, at least one intermediate substrate may be in close proximity to the wicking structure, to isolate the liquid phase and vapor phase, in at least one region of the thermal ground plane.

Supporting higher pressure differences between the liquid phase and the vapor phase allows for more heat to be transferred without drying out the wicking structure 220 as well as making the TGP more resistant to viscous losses resulting from thinner designs. Thus, the addition of the intermediate substrate 110 may achieve both higher heat transfer and thinner ground planes, simultaneously.

In some embodiments, the thermal ground plane could be filled with a specified mass of saturated liquid/vapor mixture such that difference in pressure between the vapor and liquid phases in the condenser is well controlled. In some embodiments the mass of the liquid/vapor mixture could be chosen so that part of the condenser region could contain liquid at a higher pressure than adjacent vapor.

Figure 7:
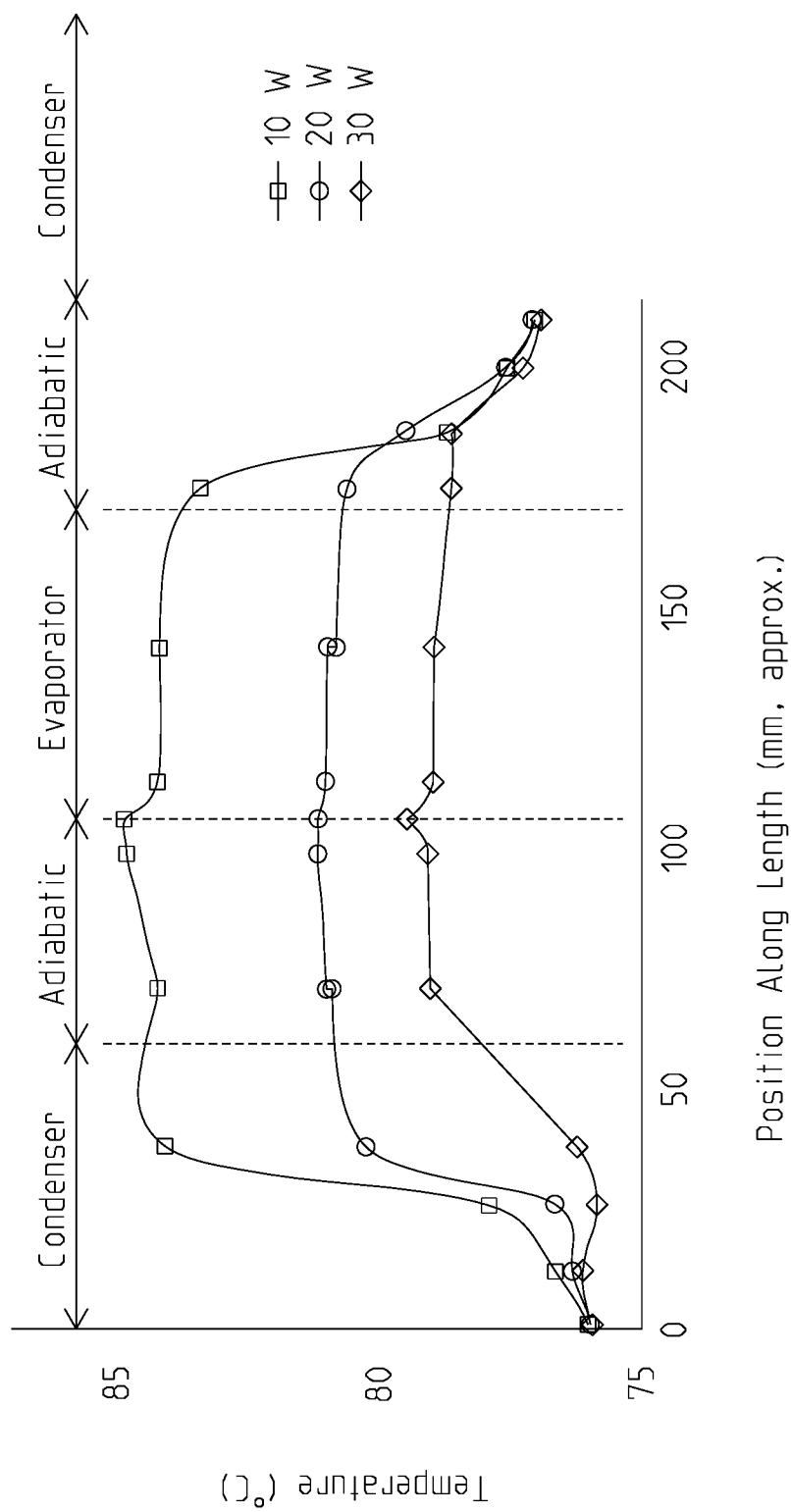
FIG. 7 shows temperature profiles as a function of axial location for an illustrative embodiment of a thermal ground plane, under heat loadings of Q=10, 20, and 30 W. In this embodiment, the evaporator is in the center, and there are adiabatic and condenser regions on each side.

FIG. 7 shows temperature profiles as a function of axial location for an illustrative embodiment of a thermal ground plane, under heat transfer rates of Q=10, 20, and 30 W. In this illustrative embodiment, the evaporator is in the center, and there are is an adiabatic and condenser region on each side. The results demonstrate the utility of an embodiment of a titanium thermal ground plane with an intermediate substrate 110.

Figure 8:
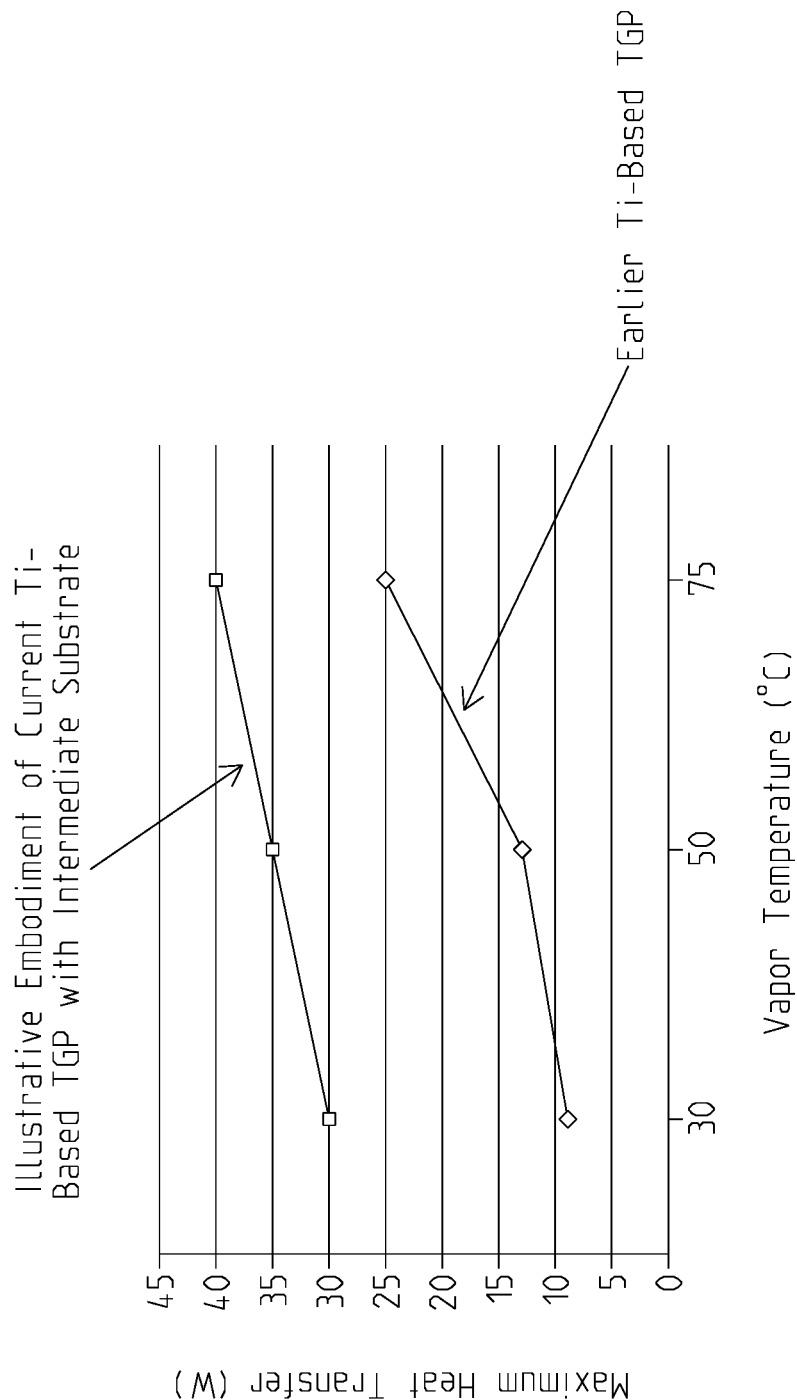
FIG. 8 compares maximum heat transfer for titanium-based thermal ground planes for different vapor temperatures. The comparison is between an earlier titanium thermal ground plane, and an illustrative embodiment of the current thermal ground plane using an intermediate substrate.

FIG. 8 compares maximum heat transfer for titanium-based thermal ground planes for different vapor temperatures. The comparison is between an earlier titanium thermal ground plane, and an illustrative embodiment of the current thermal ground plane using an intermediate substrate 110.

An earlier titanium thermal ground plane with similar dimensions to embodiments tested for FIG. 7 might only be capable of transferring about 10 W of thermal energy before the wicking structure 220 exhibits dry out at an operating vapor temperature of 30° C., compared to 30 W for an illustrative embodiment of the current thermal ground plane using an intermediate substrate 110. Similarly, as vapor temperature is increased, the maximum thermal energy transferred for an illustrative embodiment of the current thermal ground plane is increased to 35 W and 40 W, for operating vapor temperatures of 50° C. and 70° C., respectively. In all cases, the maximum thermal energy transferred for an illustrative embodiment of the current thermal ground plane is 15-20 W more than what is observed from an earlier thermal ground plane.

Figure 9:
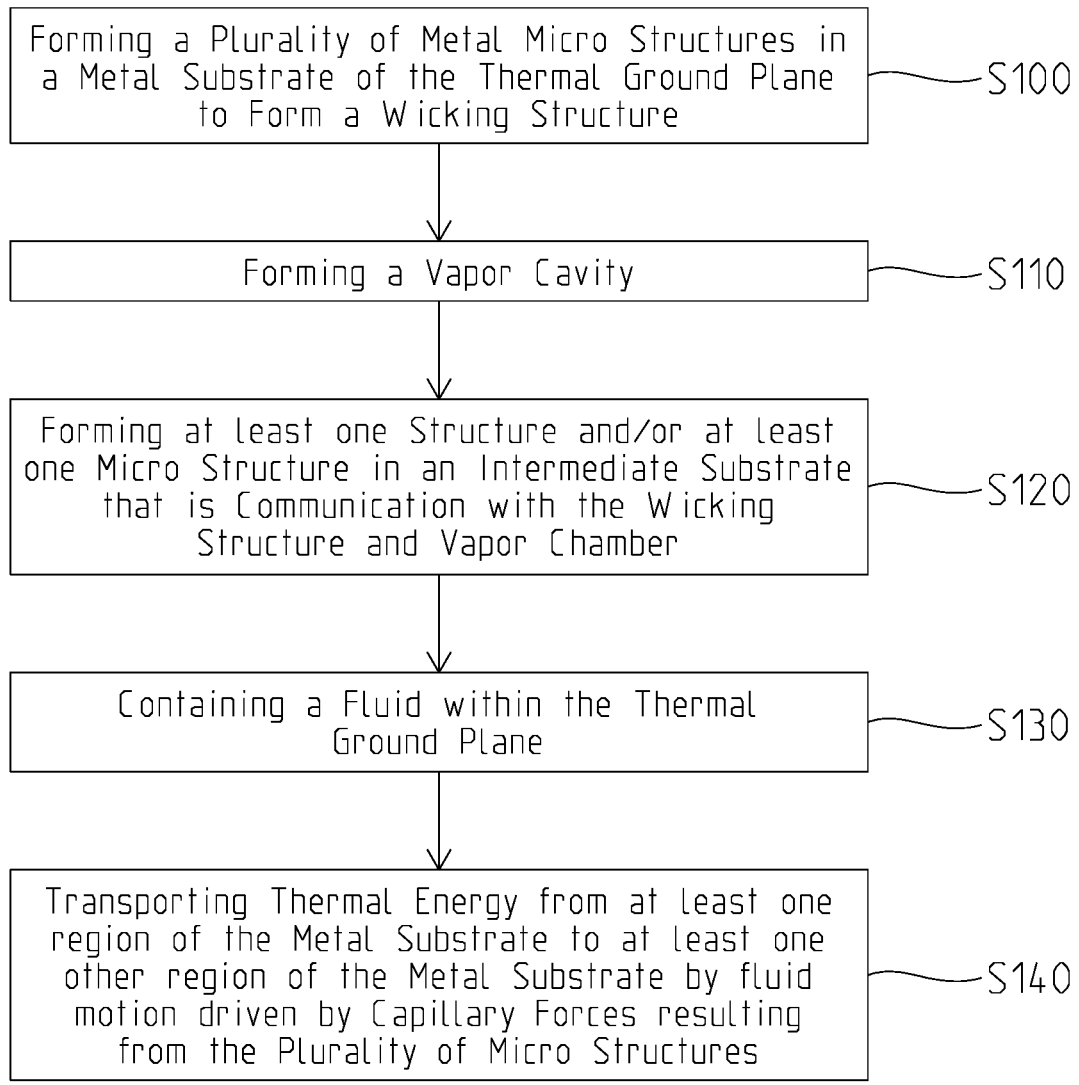
FIG. 9 is an illustrative embodiment of a flow chart of the formation of one or more embodiments of the current Ti-based TGP (metal-based Thermal Ground Plane) in accordance with one or more embodiments.

FIG. 9 illustrates a flow chart of the formation of one or more embodiments of the current Ti-based TGP in accordance with one or more embodiments of the present invention. In some embodiments, thermal energy can be transported by (1) forming a plurality of metal micro structures in a metal substrate of the thermal ground plane to form a wicking structure in step S100. In step S110, a vapor chamber may be formed. In step S120, at least one structure and/or at least one microstructure is formed in an intermediate substrate that is communication with the wicking structure and vapor chamber, wherein the intermediate substrate is shaped and positioned to increase the effective aspect ratio of the wicking structure in at least one region of the wicking structure. In step S130, a fluid may be contained within the thermal ground plane. In step S140, thermal energy may be transported from at least one region of the metal substrate to at least one other region of the metal substrate by fluid motion driven by capillary forces, resulting from the plurality of microstructures.

Figure 10:
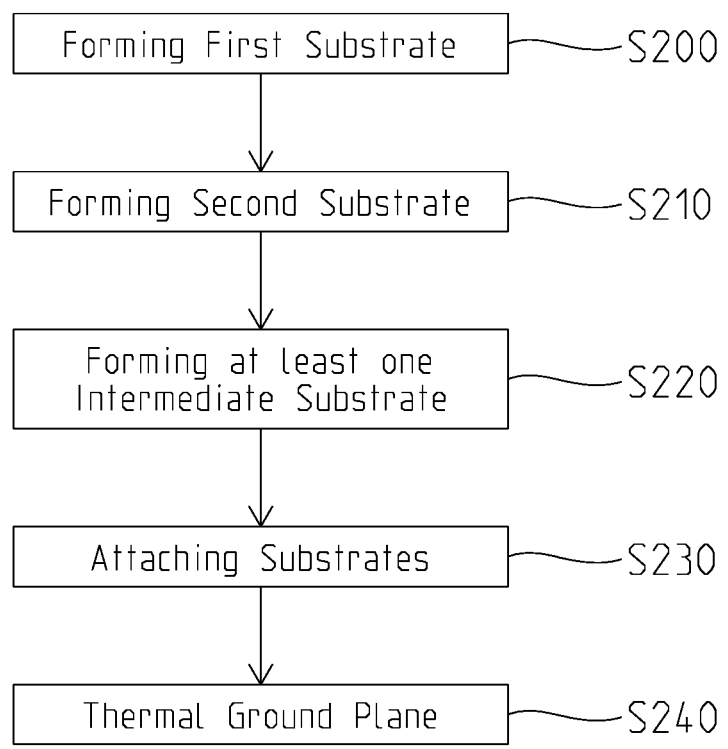
FIG. 10 is an illustrative embodiment of a flow chart of the formation of one or more embodiments of the current Ti-based TGP.

FIG. 10 illustrates a flow chart of the formation of one or more embodiments of the current Ti-based TGP in accordance with one or more embodiments of the present invention. In some embodiments a metal-based thermal ground plane can be formed by the following process. In step S200, the first substrate is formed. In step S210, a second substrate is formed. In step S220, at least one intermediate substrate is formed. In step S230, the substrates are attached. In step S240, the thermal ground plane is formed.

Figure 11A:
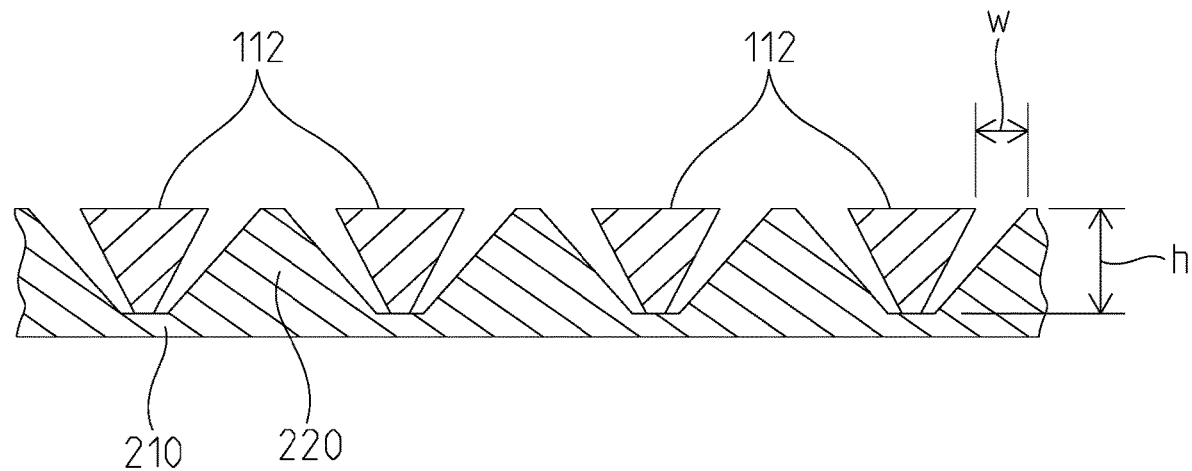
FIG. 11A shows an illustrative embodiment of a wicking structure in communication with an intermediate substrate where the microstructures in the intermediate substrate are interleaved with the wicking structure.

FIG. 11 shows illustrative embodiments of a wicking structure 220 in communication with an intermediate substrate 110. The effective aspect ratio is defined as the ratio of the effective height, h, to the effective channel width w: (A) shows an illustrative embodiment where the microstructures 112 of the intermediate substrate 110 are interleaved with the wicking structure 220, (B) shows an alternative embodiment where the microstructures 112 of the intermediate substrate 110 are positioned above the wicking structure 220.

The illustrative embodiments shown in FIG. 11 could provide effective aspect ratios that are higher than what might be obtained by the wicking structure 220 without including an intermediate substrate 110. For example, if the wicking structure 220 is formed by a wet etching or other isotropic etching process, the aspect ratio h/w may be less than unity, or substantially less than unity. Using an intermediate substrate 110, higher effective aspect ratios of the fluid channel between the wicking structure 220 and the intermediate substrate 110, may be achieved. For example, in some embodiments, h/w>1 wherein h is the effective height (or depth) of the fluid channel and w is the width.

Figure 11B:
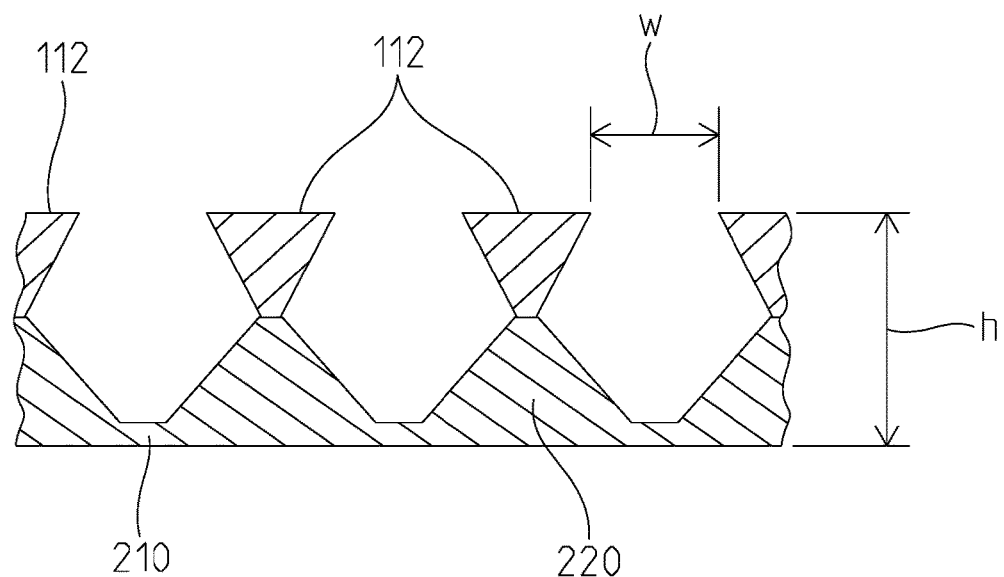
FIG. 11B shows an alternative embodiment where the microstructures in the intermediate substrate are positioned above the wicking structure.

FIG. 11(B) shows an alternative embodiment, which could have advantages when relatively low viscous losses are desirable.

Figure 12:
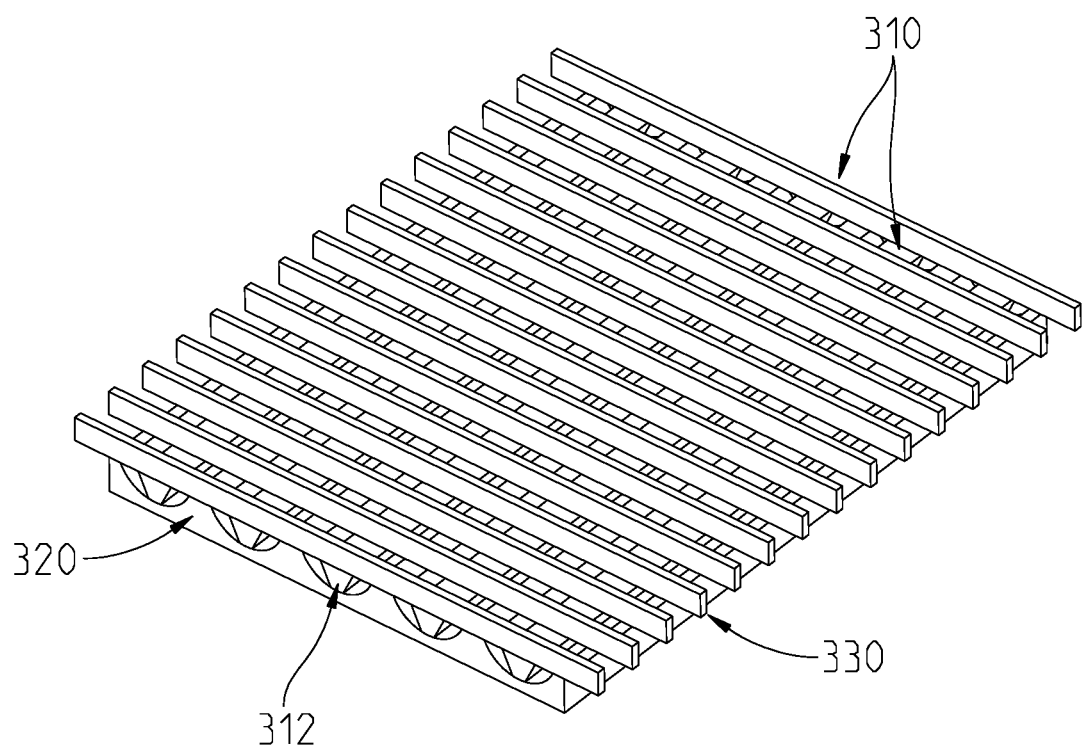
FIG. 12 is a perspective view an intermediate substrate with a plurality of supporting cross members.

FIG. 12 shows an illustrative embodiment where the intermediate substrate 310 comprises a plurality of microstructures 312 that are interleaved with the wicking structure 320. The interleaved microstructures 312 are mechanically connected to cross-members 330. In some embodiments, the interleaving microstructures 312 and the cross-members 330 are formed from a single substrate. The cross-members 330 can be formed from a metal or other material. In some embodiments, metal cross-members 330 could be comprised of titanium, copper, aluminum, stainless steel, or other metal. In some embodiments, the interleaving microstructures 312 and cross-members 330 can be formed by chemical etching metal foil, such as a titanium metal foil, copper metal foil, stainless steel metal foil, aluminum metal foil, and the like.

In some embodiments, cross-members 330 can provide mechanical support to the interleaved microstructures 312. In some embodiments, cross-members 330 can transfer thermal energy through thermal conduction between interleaving microstructures 312 or throughout the thermal ground plane. In some embodiments, the cross-members 330 can provide a wetting surface so that liquid can be transported through capillary forces along cross-members. This can provide fluid communication between interleaving microstructures.

In some embodiments, cross-members 330 can provide surface area to facilitate condensation of vapor.

Figure 13A:
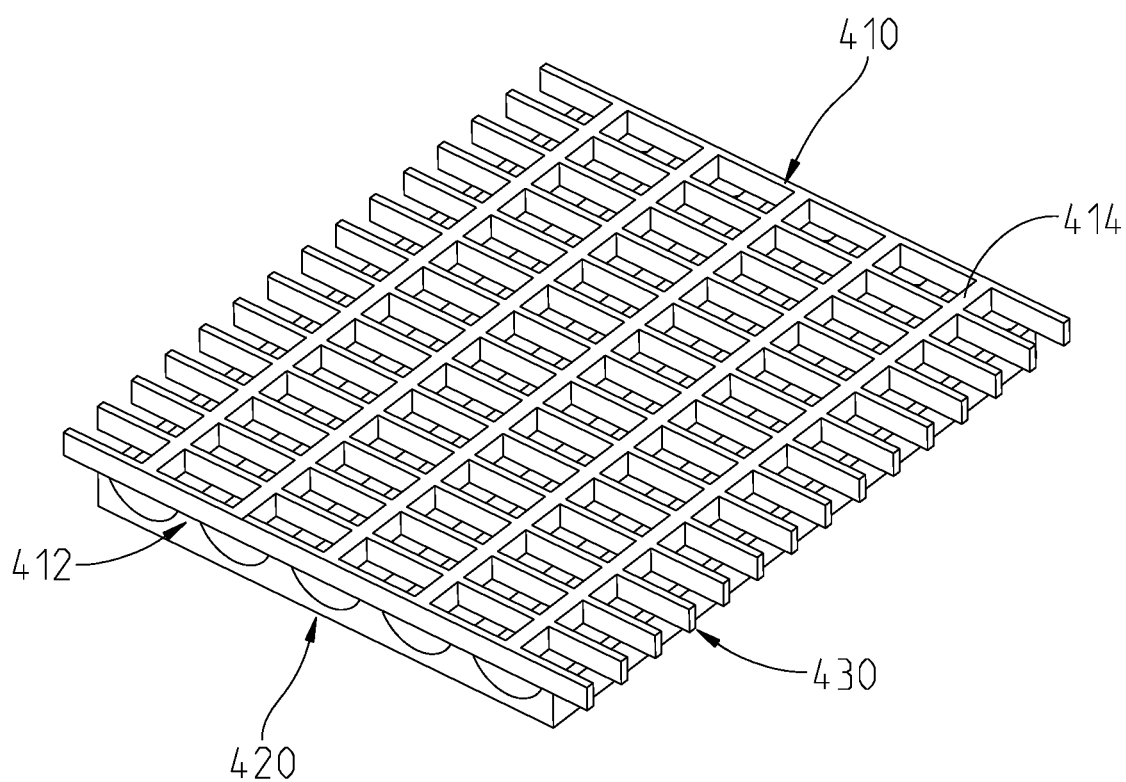
FIG. 13A is a perspective view of an intermediate substrate with supporting cross members wherein the microstructures are in communication with cross-members.
Figure 13B:
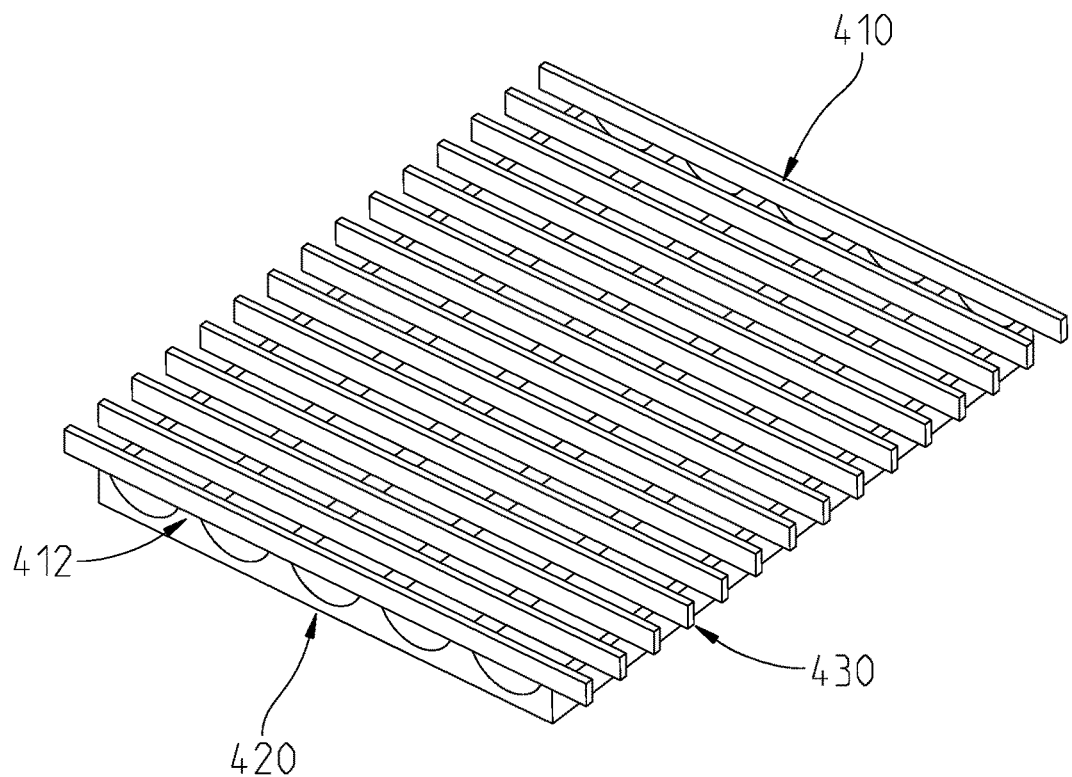
FIG. 13B is a perspective view of an intermediate substrate with supporting cross members wherein the microstructures and cross-members are positioned directly above the wicking structure.

FIG. 13 shows an illustrative embodiment where the intermediate substrate 410 comprises a plurality of cross-members 430. Wicking structure 412 is formed from metal substrate 420. FIG. 13(A) shows an illustrative embodiment wherein microstructures 414 are in communication with cross-members 430. In an illustrative embodiment, microstructures 414 and cross-members 430 can be positioned directly above the wicking structure 412. FIG. 13(B) shows an illustrative embodiment where cross-members 430 are positioned directly above the wicking structure 412.

In some embodiments, an intermediate substrate 410 could be configured with cross-members 430 and could be positioned in the condenser region of the thermal ground plane. In some embodiments, an intermediate substrate 410 could be configured with cross-members 430 and could be positioned in the adiabatic region of the thermal ground plane. In some embodiments, an intermediate substrate 410 could be configured with cross-members 430 and could be positioned in the evaporator region of the thermal ground plane.

Figure 14:
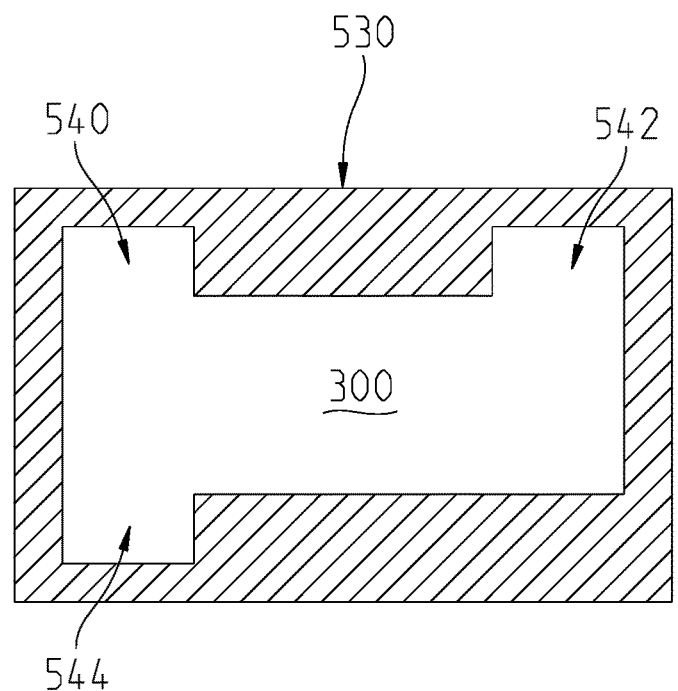
FIG. 14 is a profile view of an illustration of a vapor chamber with one or more recessed regions.

FIG. 14 shows a profile view an illustrative embodiment where a vapor chamber can be comprised of one or more recessed regions 540, 542 and 544. Viscous flow of vapor in the vapor chamber can be described by Poiseuille flow, where for a given pressure drop, density and viscosity, the mass flow rate of vapor scales with the cube of the vapor chamber height ~h3. For very thin vapor chambers, viscous losses can be substantial and limit the overall performance of the thermal ground plane. In some embodiments, vapor chambers 300 can be configured with one or more recessed regions 540, thereby increasing the effective height of the vapor chamber, h, in chosen regions of the thermal ground plane. Since the mass flow rate of vapor can vary with h3, increasing the height of the vapor chamber in chosen regions can substantially increase the mass flow rate of vapor through the chamber, for a given pressure drop.

In some embodiments, the one or more recessed regions 544 can be formed in the metal substrate and located adjacent to the wicking structure. In some embodiments, the one or more recessed regions 540 and 542 can be formed in the backplane 530. In some embodiments, the one or more recessed regions can be formed in a combination of the metal substrate and backplane. In some embodiments, recessed regions can be configured to be in communication with other recessed regions, in order to minimize viscous losses in the vapor chamber. In some embodiments, recessed region 540 could be aligned with recessed region 544, so that the overall depth of the vapor chamber in that region is increased by the combination of recessed region 540 and recessed region 544. Vapor mass flow rate can vary with the vapor chamber height cubed, ~h3. Therefore, the combination of recessed region 540 and recessed region 544 can have a non-linear effect on reducing viscous losses, and thereby increase overall mass flow rate.

Figure 15:
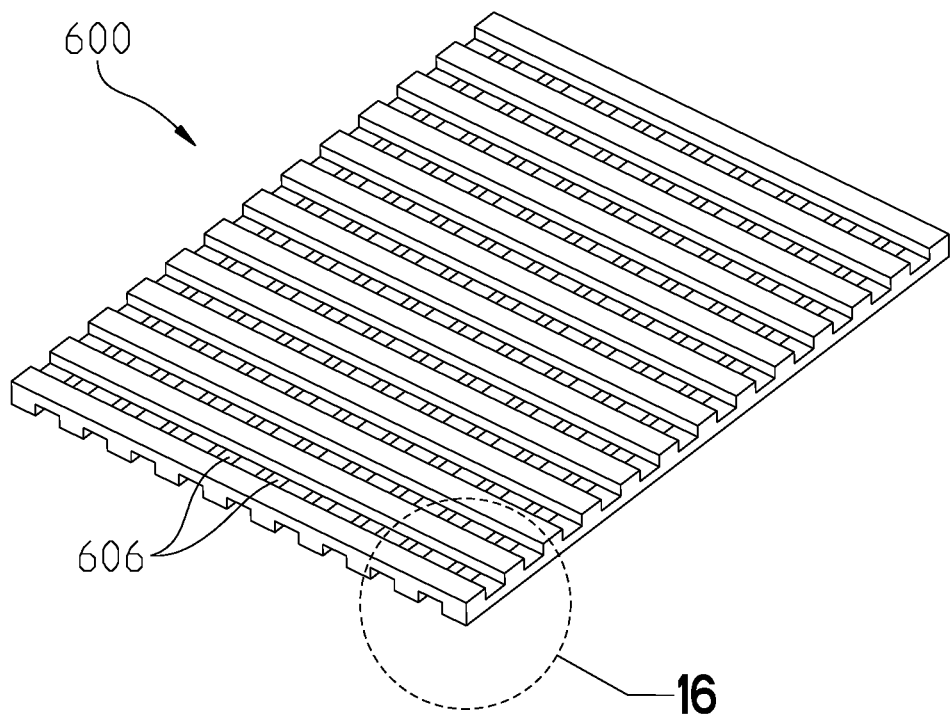
FIG. 15 is an intermediate substrate that has an orthogonal lattice with apertures therethrough bounded by cross members.
Figure 16:
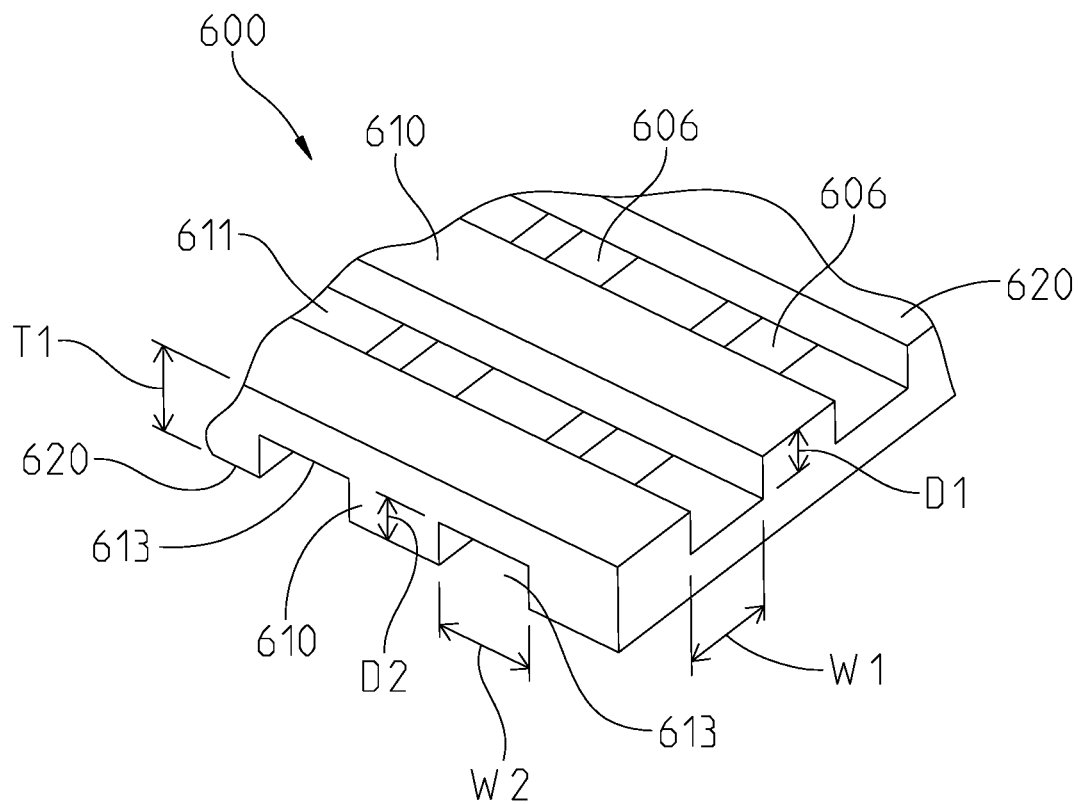
FIG. 16 is a magnified view of the intermediate substrate from area 16 as shown in FIG. 15.

FIGS. 15 and 16 provide an example of an intermediate substrate 600 that is an orthogonal lattice having apertures 606 formed within the intermediate substrate. The intermediate substrate 600 may be formed by standard wet chemical etching techniques. Other processes that can be used may be etching, dry etching, micromachining, sawing or other types of processes that allows for formation of the orthogonal lattice type of intermediate substrate 600. The orthogonal lattice of the intermediate substrate 600 is formed by cross members 610 that are orthogonal with respect to each other. The cross members 610 of the intermediate substrate are formed out of a monolithic material. The material of the intermediate substrate may be titanium, aluminum, copper, or stainless steel. The cross members 610 are formed by taking a continuous sheet of material and selectively removing the material to a depth D1 or D2 which represents a distance inward from the outer surfaces 620 that define the thickness of the material.

Figure 21:
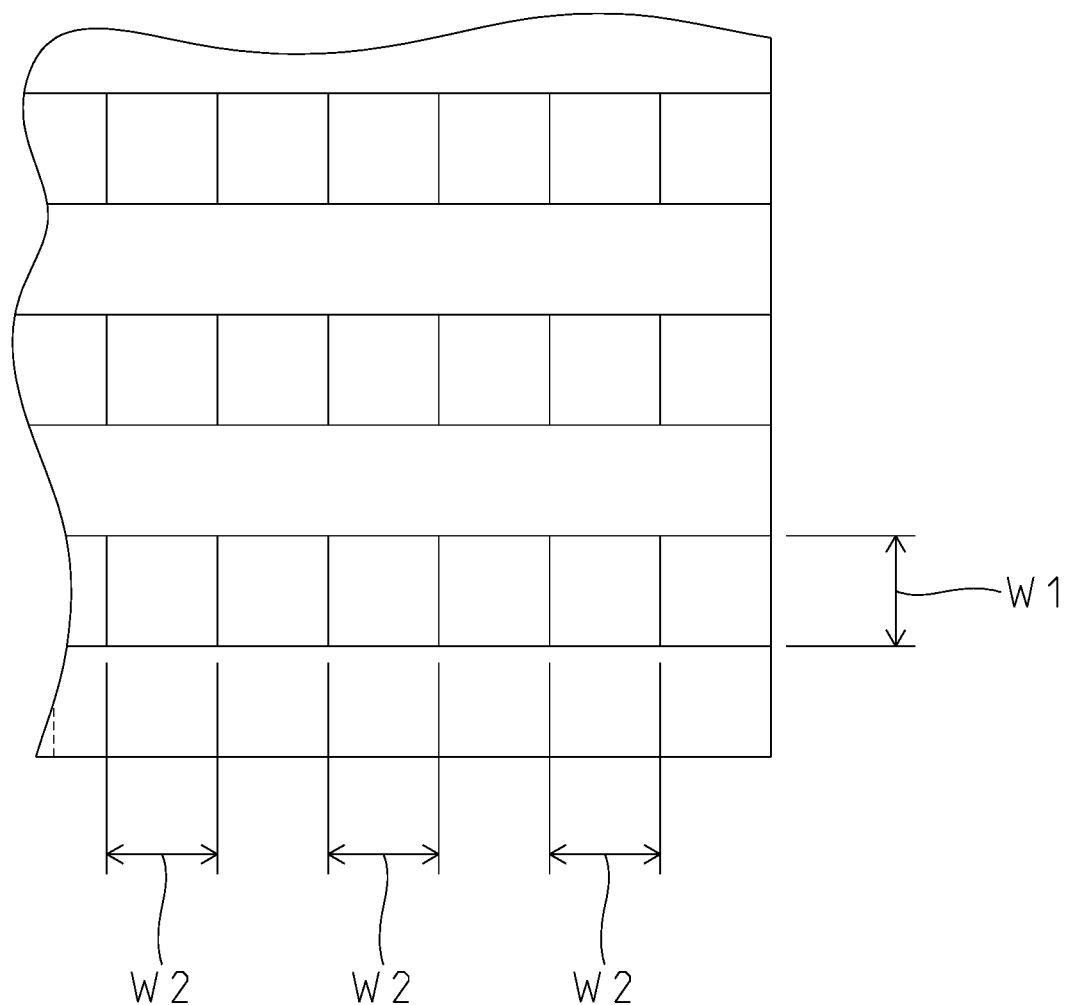
FIG. 21 is a top view of multiple intermediate substrates as shown in FIGS. 15-20 directly overlying each other with no offset of the apertures.

As viewed in FIGS. 15 and 16, the removed material from between the cross members 610 on the upper side of the intermediate substrate 600 extends to a consistent depth D1 across the entire intermediate substrate 600. Likewise, the removed material from between the cross members 610 on the lower side of the intermediate substrate 600 extends to a consistent depth D2 across the entire intermediate substrate 600. Frequently, the depth D1 and D2 are the same. D1 and D2 may be as small as 50 µm. In the case that D1 is the same as D2, those distances must be at least half of the thickness T1 of the intermediate substrate 600 so that the removed material areas between the cross members 610 intersects to form the apertures 606 bounded by the cross members 610. The removed areas between adjacent cross members 610 forms channels 611, 613 in the location of the removed material and those channels 611, 613 intersect to form the apertures 606. When D1 and D2 are more than half of the thickness T1 of the intermediate substrate 600, that will decrease the thickness of the cross members 610. As shown in FIGS. 15 and 16, the cross members 610 are half of the thickness T1 of the intermediate substrate 600. The intermediate substrate 600 being formed as described has one set of cross members 610 in one plane running one direction and another set of cross members 610 opposite to the first set in another plane and running orthogonal to the first set of cross members 610. The distances between the cross members 610 are indicated as W1 for the upper cross members 610 and W2 for the lower cross members in FIG. 16. These distances W1 and W2 define the lateral widths of the apertures 606 in orthogonal directions and W1 often is equal to W2 as shown in FIGS. 15 and 16. The lateral width W1 and W2 also define the widths of orthogonal channels 611, 613 respectively that run in opposite planes within the intermediate substrate 600. Thus, the apertures 606 form square openings when viewed from directly above. The square nature of the apertures 606 is shown in FIG. 21 which shows the intermediate layer 600 viewed from directly above.

Figure 17:
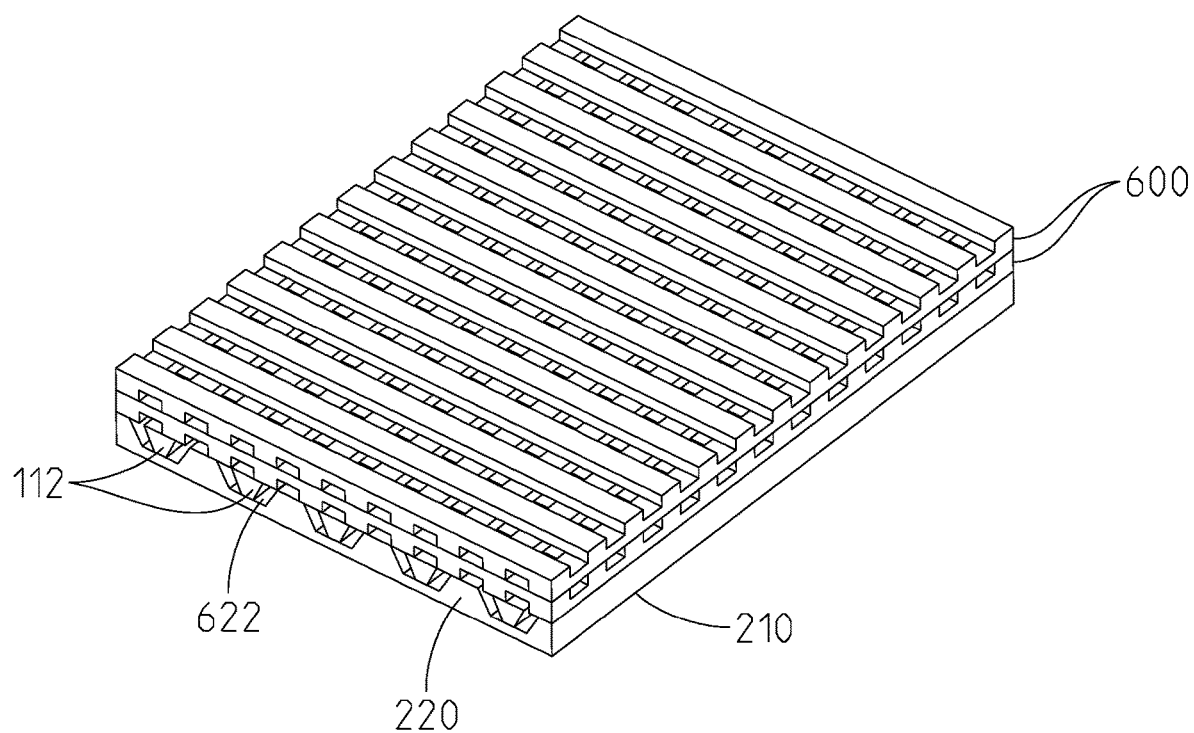
FIG. 17 is a perspective view of multiple intermediate substrates shown in FIGS. 15 and 16 overlying a metal substrate with microstructures within a wicking structure of the metal substrate.

Multiple intermediate substrates 600 may be used to provide for a large aspect ratio structure. The intermediate substrates 600 may be located in various areas of the thermal ground plane within the vapor chamber 300. Often, the intermediate substrates 600 as shown in FIGS. 15 and 16 are used in the evaporator region of the thermal ground plane. FIG. 17 shows multiple intermediate substrates 600 overlying the wicking structure 220 in the metal substrate 210. This may be two or more intermediate substrates 600. As shown in FIG. 17, two intermediate substrates 600 are stacked together and are in direct overlying contact with wicking structure 220 on the metal substrate 210. The wicking structure 220 has grooves 622 that provide wicking of the working fluid though capillary action and the grooves 622 are separated by ridges 619 located between the grooves 622. As discussed above, the increasing the aspect ratio may enhance capillary action. Using the intermediate substrate 600 in combination with the wicking structure 220 or using multiple intermediate substrates 600 in combination with the wicking structure 220 can increase the aspect ratio and thereby increase capillary action. In the case of using a single intermediate substrate 600 with the wicking structure 220, the apertures 606 overlying the grooves 622 cooperate to define a high aspect ratio fluid path whereby the working fluid must travel through the grooves 622 and through the apertures 606 so that the working fluid may evaporate into the vapor chamber 300. Generally, the fluid path is the path that the working fluid must take from the metal substrate 210 to the vapor chamber. In the case shown in FIGS. 15 and 16, the working fluid contacts the metal substrate 210 at the wicking structure 220. Although the enclosure comprising the vapor chamber 300 is not shown in FIGS. 17-20 and 22-24, the vapor chamber 300 is directly above the intermediate substrates 600 and opposite the wicking structure 220. The intermediate substrates 600 are contained within the vapor chamber 300. A single intermediate substrate 600 overlying the wicking structure 220 enhances the aspect ratio beyond that of just the wicking structure 220. In some cases, a single intermediate substrate 600 may enhance the aspect ratio to a desired level. It is contemplated that the intermediate substrate 600 may itself serve as the wicking structure 220 and potentially eliminate the need for the wicking structure 220 on the metal substrate 210. In addition to the intermediate substrate or layers 600, microstructure 112 in the form of elongate members may be placed within the grooves 622 of the wicking structure 220 to enhance the aspect ratio within the wicking structure and this is shown in FIG. 17. These microstructures 112 may be attached to the intermediate substrate 600 nearest the wicking structure 220 so that the fit of multiple microstructures is complementary with the grooves 622 as shown in FIG. 17. In this way the intermediates substrate 600 spaces the microstructures 112 to fit within the grooves 622 of the wicking structure 220. The cross members 610 connected to the microstructures 112 may be parallel to the microstructures as shown in FIG. 17, or the cross members 610 connected to the microstructures 112 may be perpendicular to the microstructures 112. Thus, the microstructures 112 fit in a complementary manner to the grooves 622 which are microstructure defining the wicking structure 220. In either configuration, the intermediate substrate 600 may be used to set the pitch or spacing of the microstructures 112. The manner in which the intermediate substrate 600 sets the spacing of the microstructures facilitates movement of fluid by capillary forces in at least two orthogonal directions along microstructures 112 and along said intermediate substrate 600. Further, the intermediate substrate 600 facilitates fluid being driven by capillary forces in at least two orthogonal directions within the intermediate substrate 600 itself via its own channels 611, 613. It is contemplated that the cross members 610 in the intermediate substrate are not orthogonal and the cross members 610 can be at any oblique angle with respect to each other. Such a non-orthogonal configuration will still cause capillary forces in two directions adjacent to the cross members 610. This multidirectional wicking may facilitate using just an intermediate substrate for the wicking structure and may obviate the need for the microstructures 112 or the grooves 622.

Figure 18:
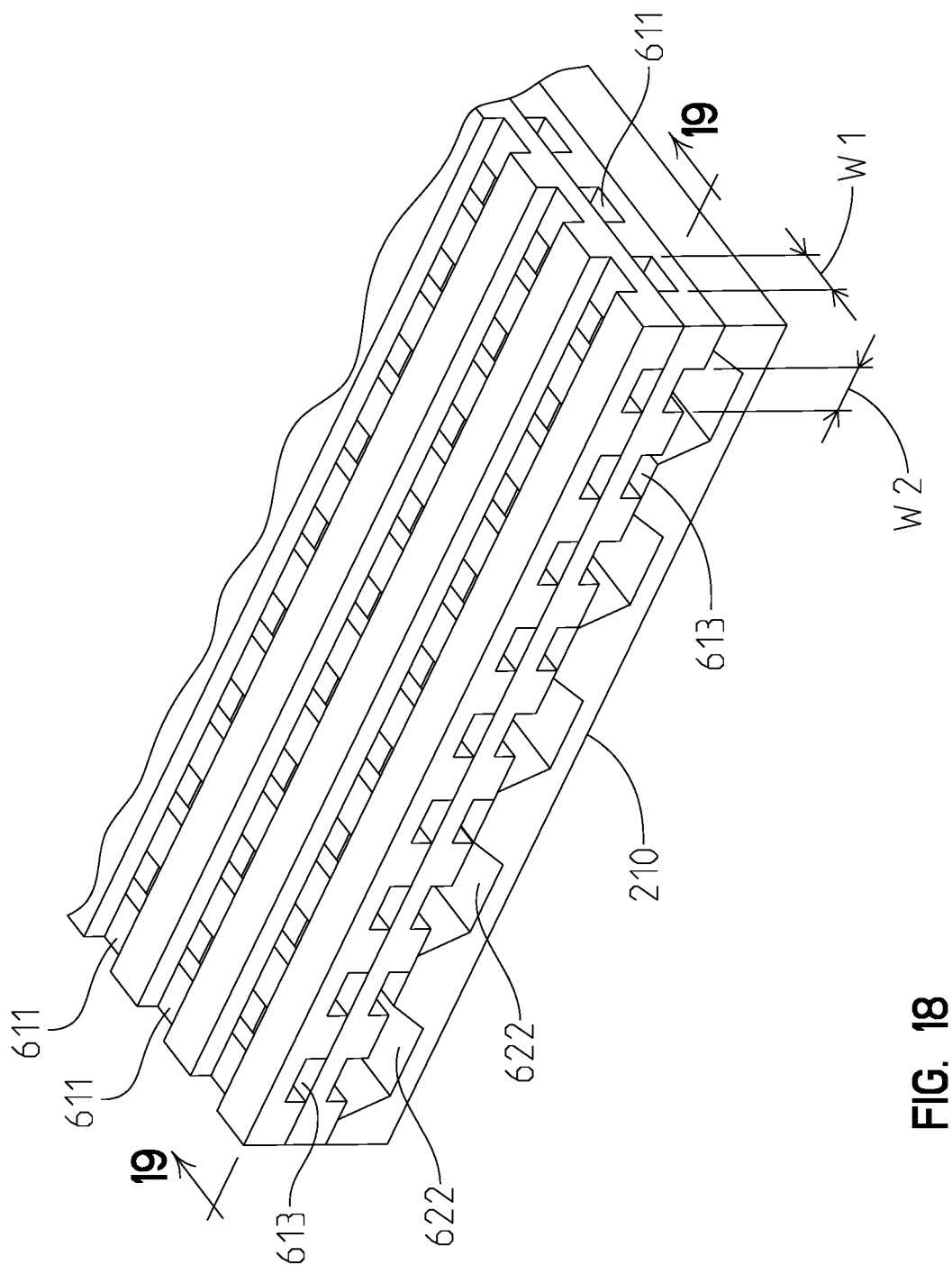
FIG. 18 a magnified perspective view of multiple intermediate substrates shown in FIGS. 15-18 overlying a metal substrate without microstructures held within a wicking structure of the metal substrate.
Figure 19:
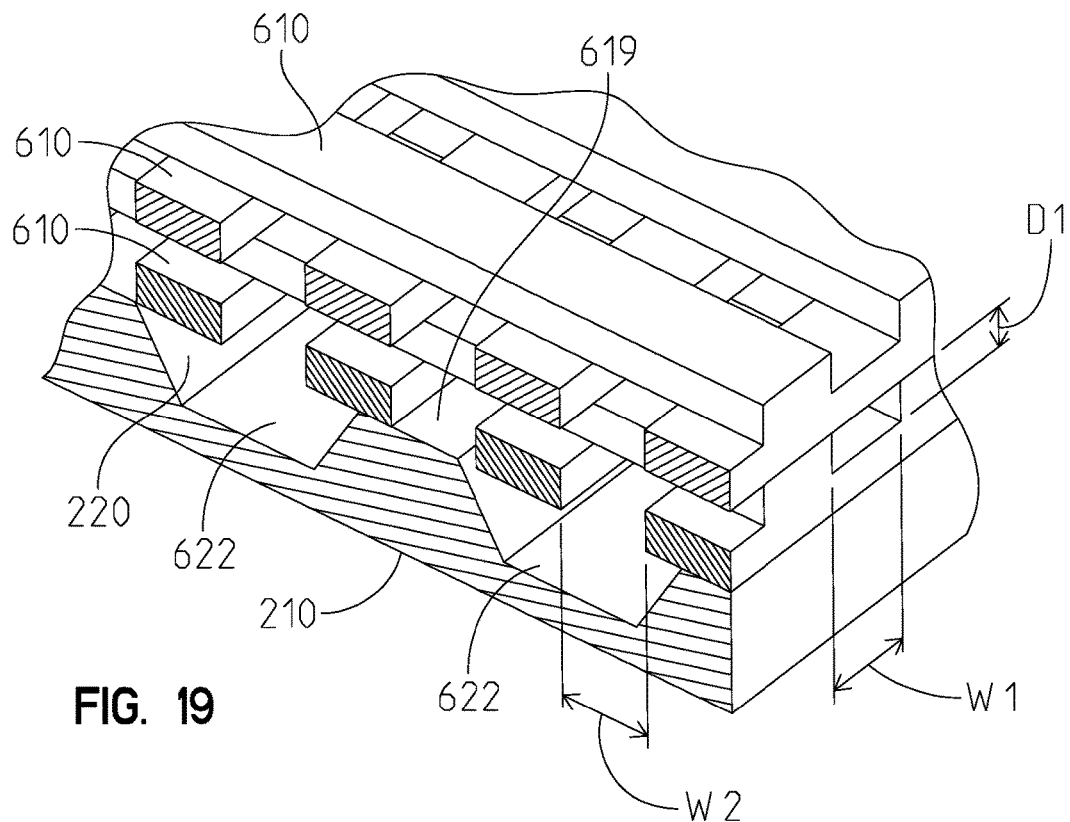
FIG. 19 is a magnified sectional perspective view of two intermediate substrates as shown in FIGS. 15-19 overlying the metal substrate.
Figure 20:
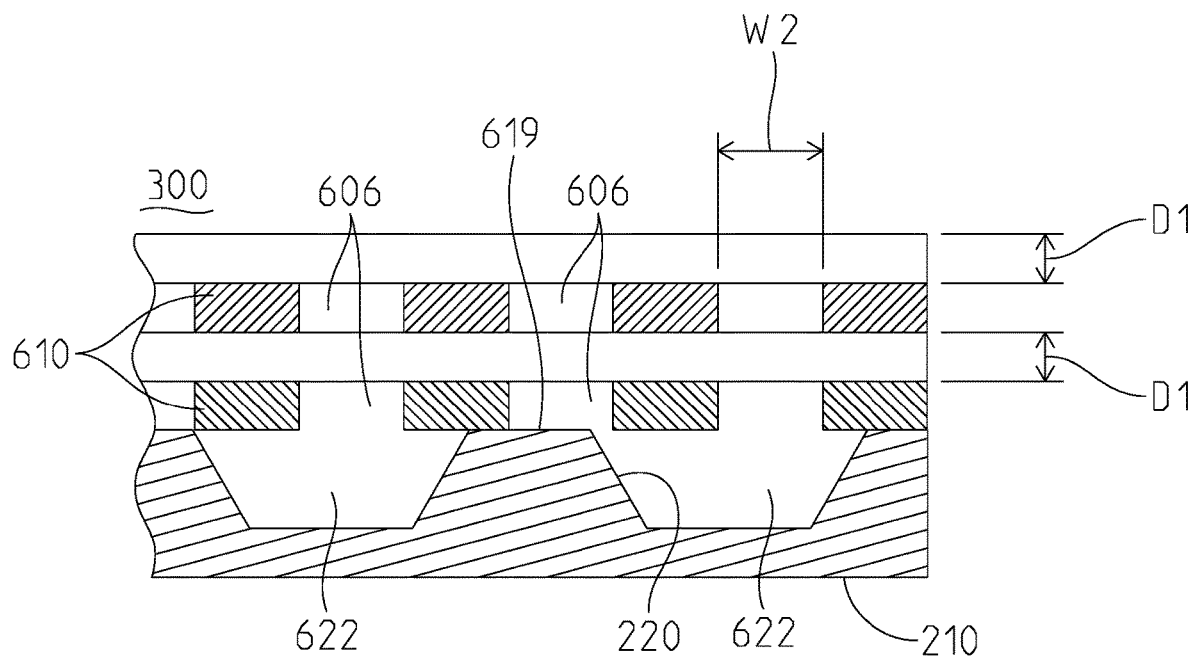
FIG. 20 is a sectional view of the intermediate substrates as shown in FIG. 19.

FIG. 17 also shows a second intermediate substrate 600 may be positioned above a first intermediate substrate 600 that is adjacent to the wicking structure 220. Because the intermediate substrates 600 are made of a heat conducting metal, they add to the heat dissipation characteristics of the thermal ground plane and help thoroughly conduct heat into the working fluid. When the intermediate substrates 600, are stacked, it may be done so that the apertures are aligned in a vertical direction as shown in FIGS. 17 and 18. In other words, the apertures 606 are plumb with respect to each other. The alignment of multiple intermediate substrates 600 stacked with the apertures 606 aligned will leave openings as shown in FIG. 21. FIGS. 19 and 20 further clarify the aligned nature of the apertures 606 in the stacked intermediate substrates 600 above the wicking structure 220.

Figure 22:
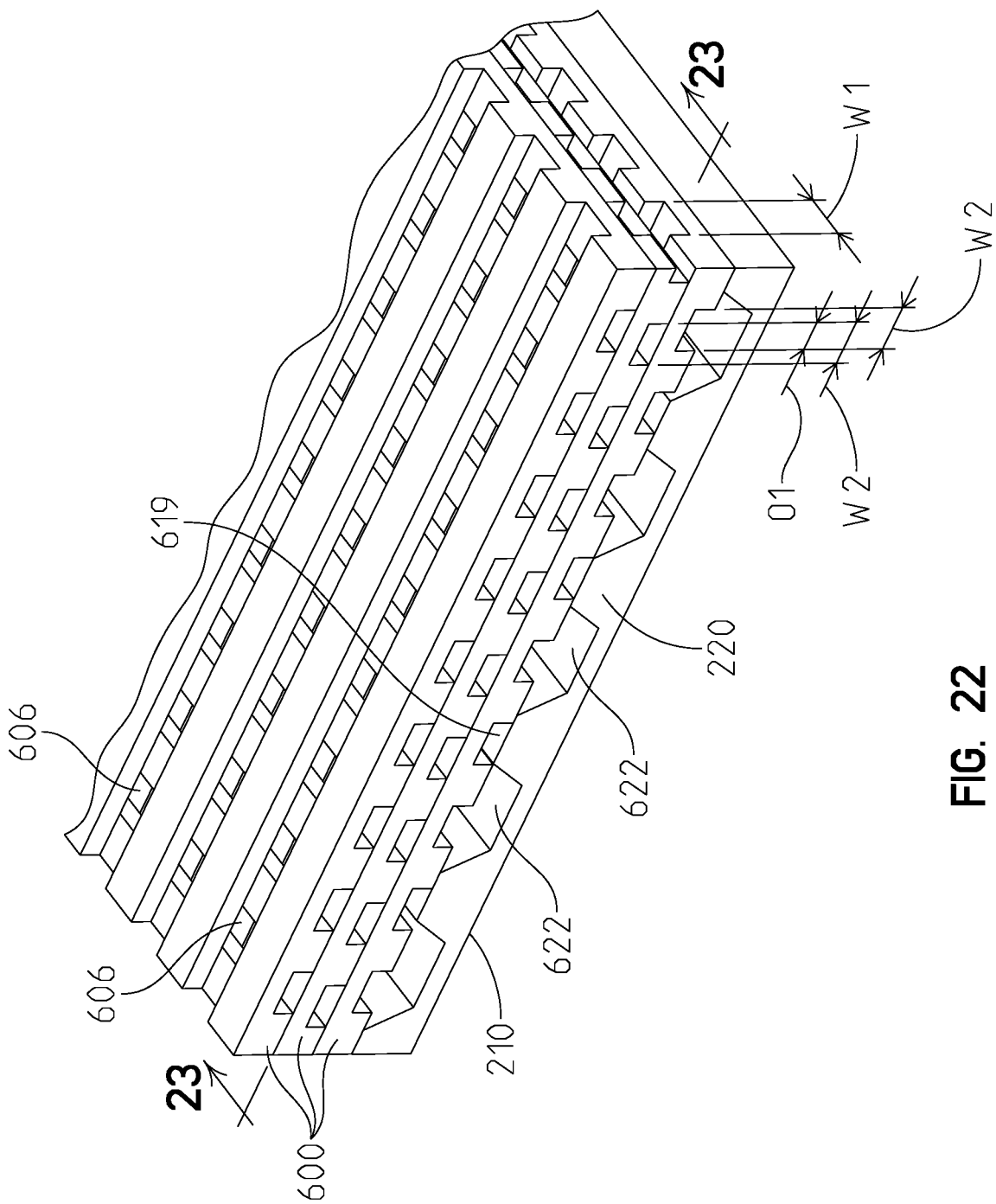
FIG. 22 is a perspective view of three intermediate substrates as shown in FIGS. 15-21 overlying the metal substrate with the middle intermediate substrate having its apertures offset with respect to the outer two intermediate substrates.
Figure 23:
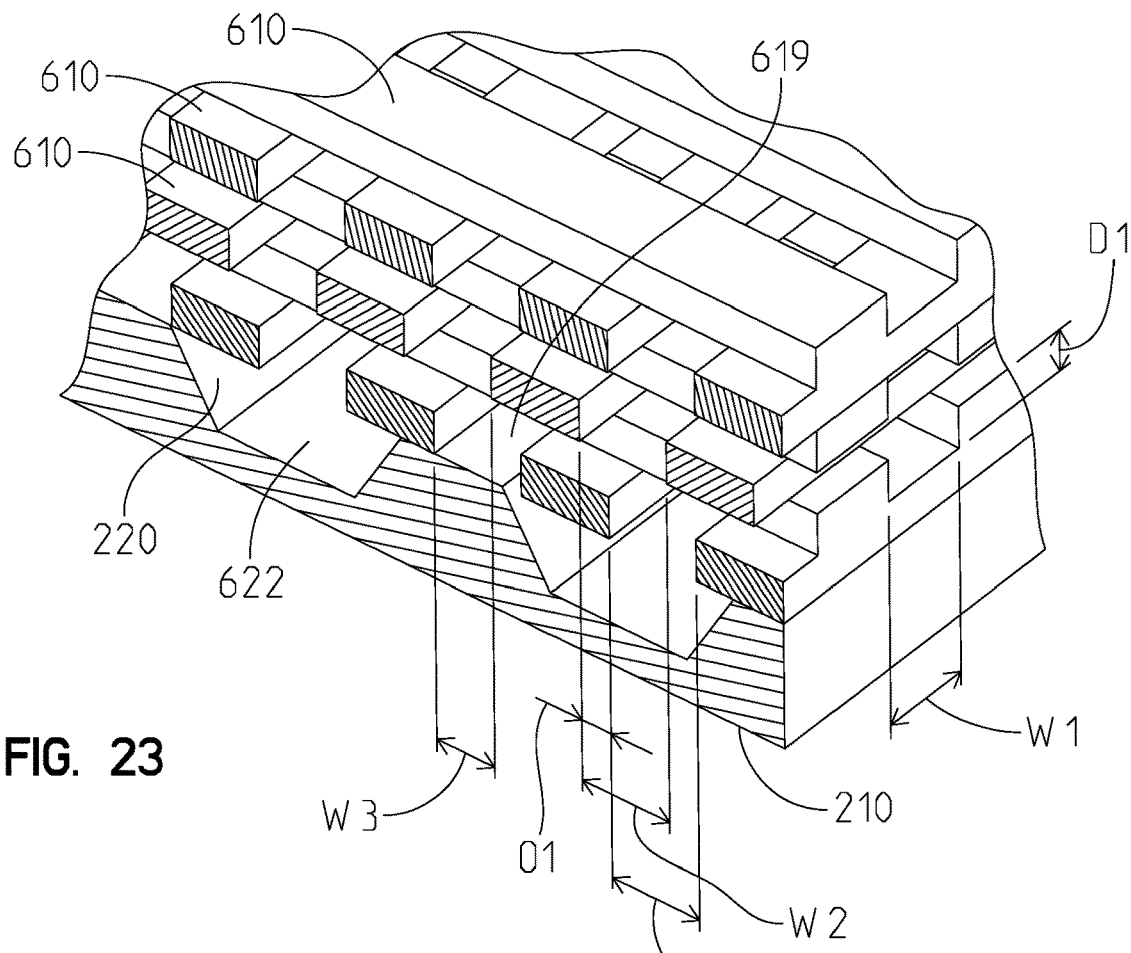
FIG. 23 is a sectional view taken about line 23-23 in FIG. 22.
Figure 24:
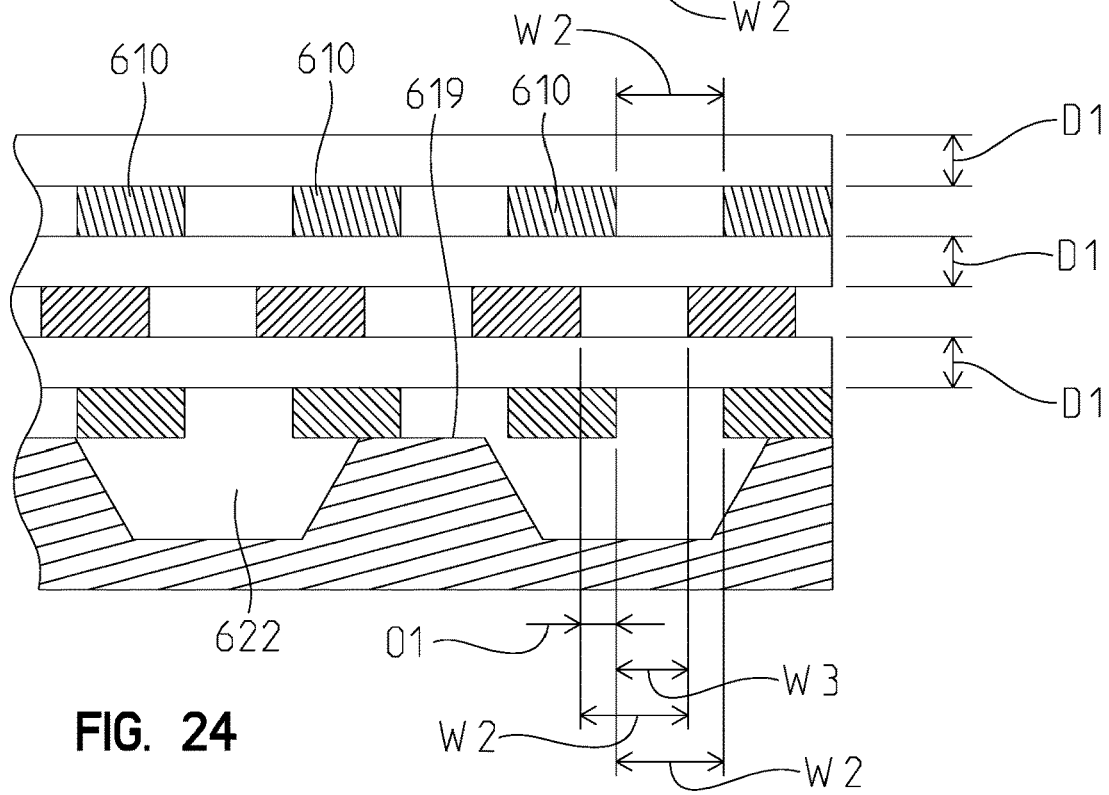
FIG. 24 the sectional view shown in FIG. 23 viewed perpendicular to the cross members sectioned within the view.
Figure 25:
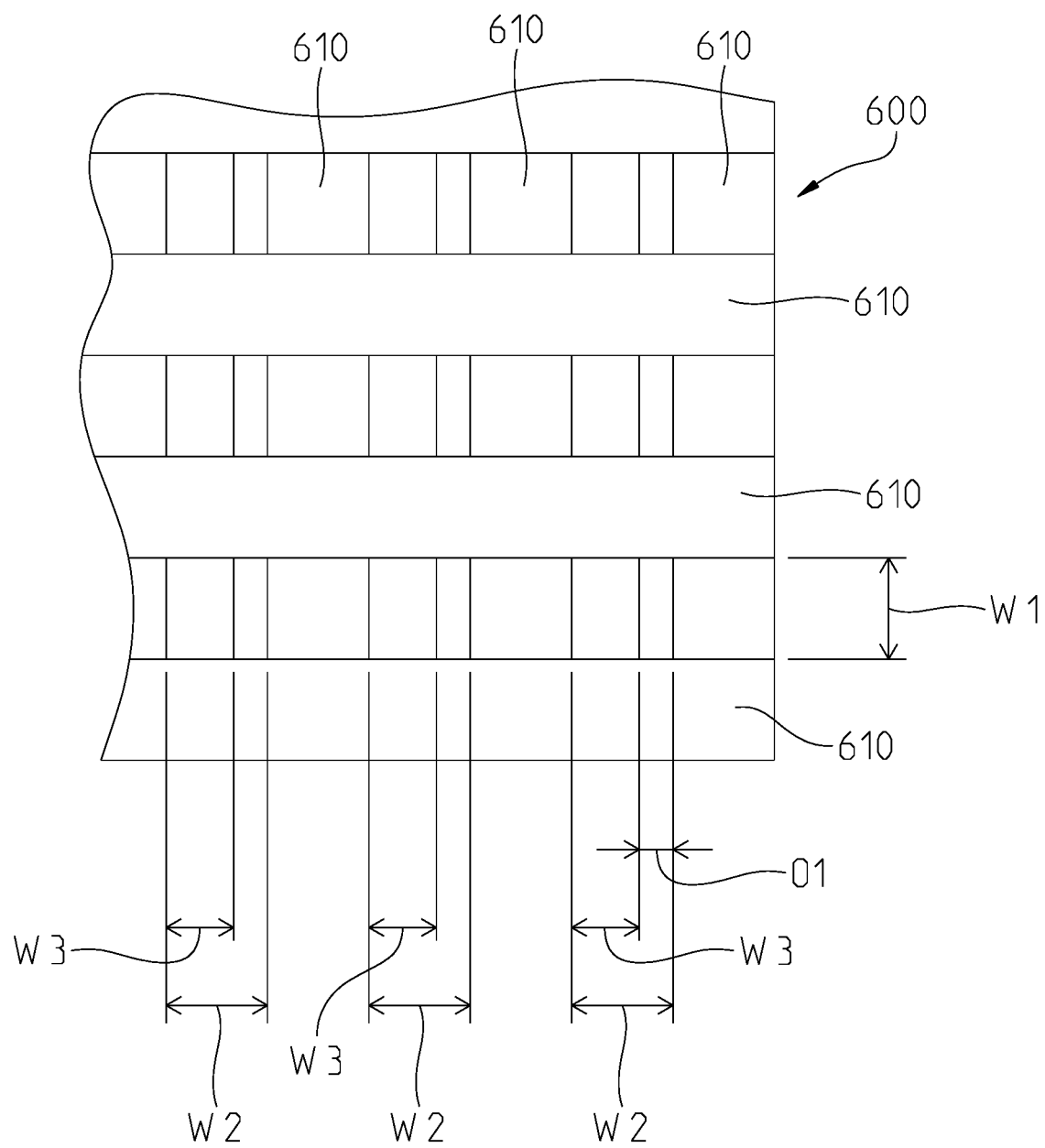
FIG. 25 is a top view showing how the apertures within the intermediate substrates are offset with respect to each other.

The aspect ratio may be further enhanced by shifting adjacently stacked intermediate substrates 600 by an offset O1 with respect to each other so that the apertures 606 are not aligned in a vertical direction. This is shown in FIG. 22 where three intermediate substrates 600 are used. This can also be done with as few as two intermediate substrates 600, although FIG. 22 shows three intermediate substrates 600. Having multiple intermediate substrates 600 defines a fluid path that is through the apertures 606 in the intermediate substrates and into the vapor chamber 300. It is contemplated that only using the two intermediate substrates 600 nearest the wicking structure 220 as shown in FIGS. 22-24, which are offset with respect to each other may provide the enhanced aspect ratio through the apertures 606 necessary for some applications. As can be seen, O1 indicates a shift between the lowermost intermediate substrate 600 adjacent to the wicking structure 220 and the intermediate substrate immediately above it. The offset O1 between intermediate substrates reduces the fluid path for the working fluid to be narrower than the narrowest dimension of the apertures 606 in either of the intermediate substrates 600. This narrower effective aperture width W3 makes the narrowest path through the intermediate substrates 600 smaller than the smallest dimension of the apertures 606 in the intermediate substrates 600 and thereby increases the aspect ratio for the fluid path. The narrowness of the fluid path through the intermediate substrates 600 and the effective aperture width W3 can be chosen by the amount of the offset O1 between intermediate substrates 600. The greater the offset O1 is made to be, the narrower the effective aperture width W3 becomes and the narrower the fluid path. It is also contemplated that the apertures 606 may be other than square shapes between cross members 610. For instance, round holes in adjacent intermediate substrates could be shifted by an offset to shrink the effective diameter of the holes and thereby increase the aspect ratio by making the holes effectively smaller than the diameter of adjacent holes in adjacent intermediate substrates. It may also be the case that the cross members 610 may not be orthogonal.

Offsetting intermediate substrates 600 as discussed above may serve the purpose of making the thermal ground plane more effective than certain fabrication processes would otherwise allow. Certain fabrication processes may only provide the ability to create apertures 606 in the intermediate substrates down to a particular minimum size. Therefore, having two intermediate substrates 600 adjacent to each other and having their apertures 606 offset could provide an effectively smaller aperture than the machining process producing the individual intermediate substrates would allow. It should also be noted, that the offset O1 need not be orthogonal as described above, but the offset O1 can be an any direction that shifts the alignment of apertures 606 between stacked intermediate substrates.

Figure 26:
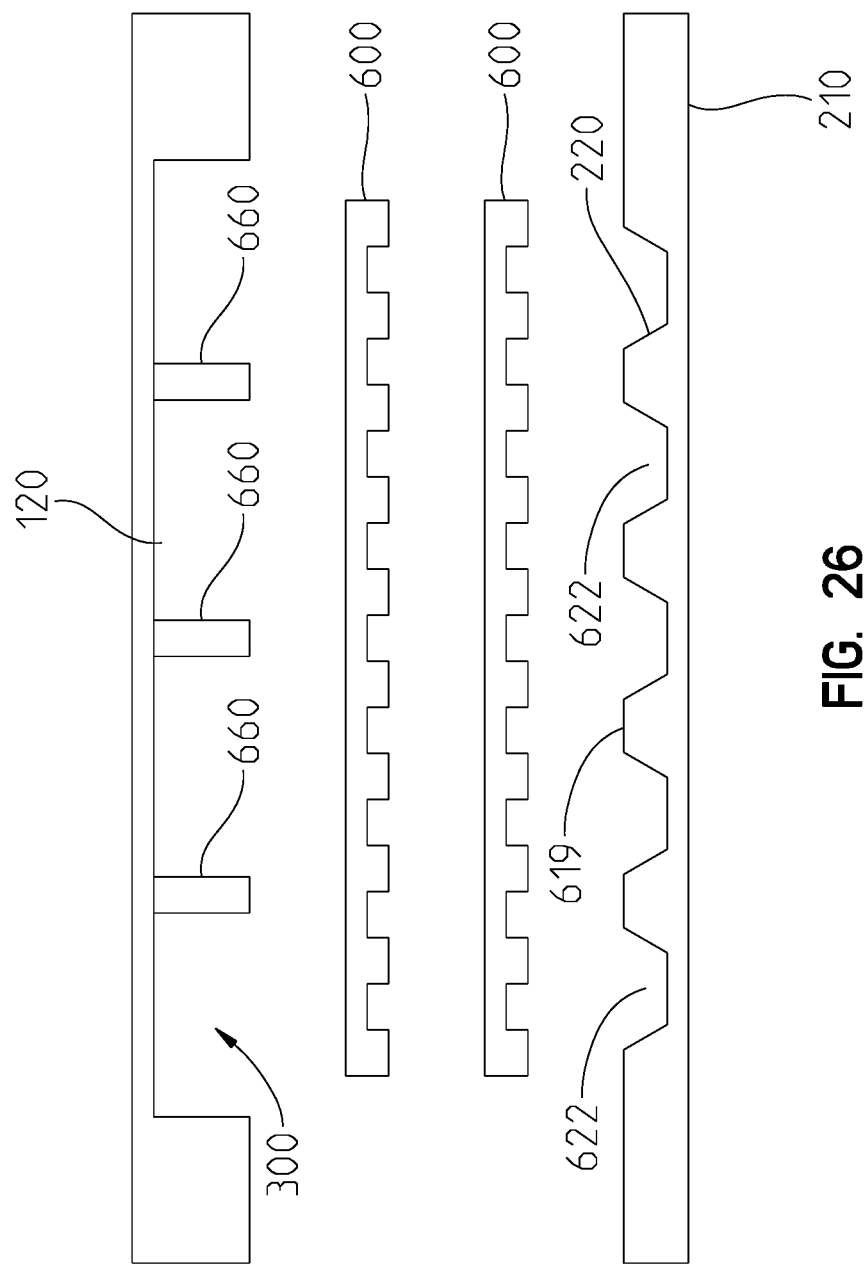
FIG. 26 is a view showing multiple intermediate substrates as shown in FIGS. 15-25 overlying a metal substrate where the metal substrate does not contain a wicking structure.

FIG. 26 shows the overall exploded assembly of the intermediate substrates 600 as they are used in the thermal ground plane. The backplane 120 that defines the vapor chamber 300 is opposite the metal substrate 210 and the wicking structure 220 thereon. The intermediate substrates 600 are held within the vapor chamber 300. The backplane 120 is hermetically sealed to metal substrate 210 to define the vapor chamber 300. When that hermetic seal is made that defines the vapor chamber 300, non-condensing gasses must be removed. During the evacuation process to remove the non-condensing gasses there may be tremendous force exerted on the backplane 120 by atmospheric pressure. To prevent collapse of the backplane 120 supports 660 may extend from the backplane 120 onto the intermediate substrate 600 nearest the backplane 120. The intermediate substrates 600 are located between the supports 660 and the wicking structure 220 on the metal substrate 210 when the assembly is complete.

Figure 27:
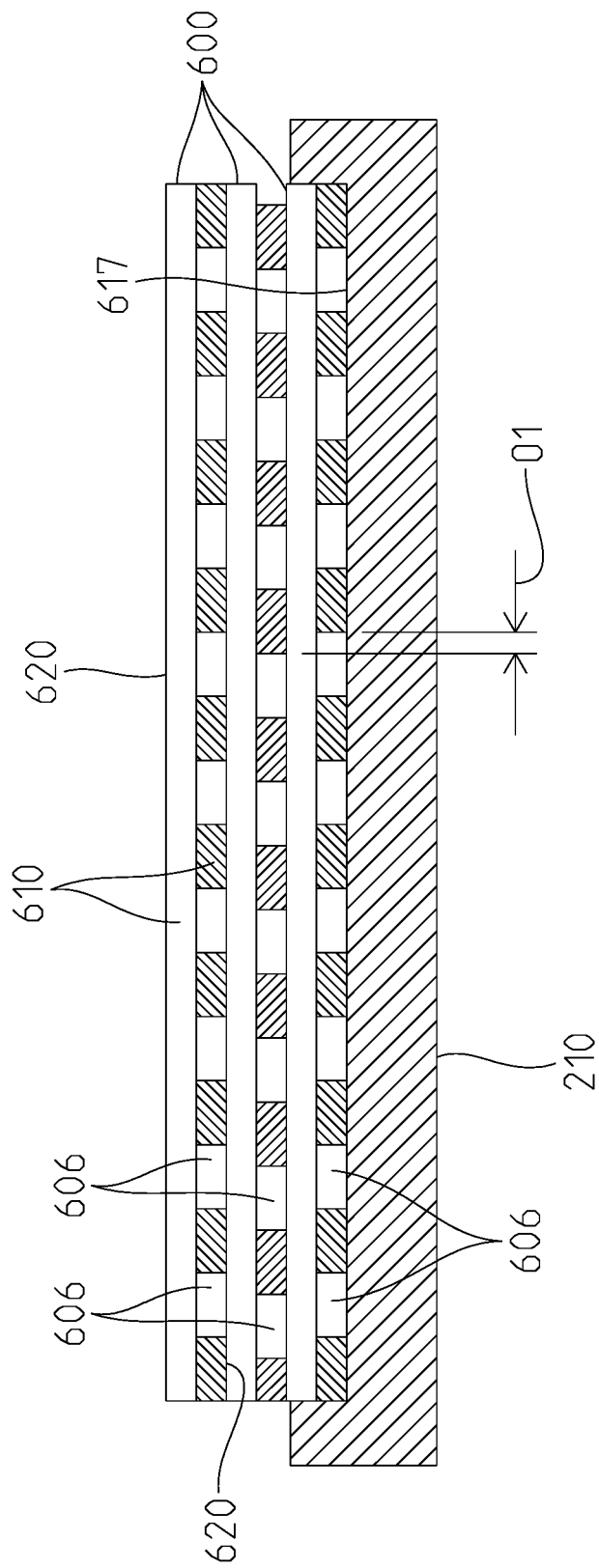
FIG. 27 is a sectional view having the intermediate substrates as the wicking structure.

FIG. 27 is an example of a configuration for the thermal ground plane wherein the intermediate substrates 600 themselves are the wicking structure. In this configuration, the intermediate substrates 600 provide enough wicking through the channels 606 between the cross members 610. As can be seen in FIG. 27 the offset O1 may enhance the aspect ratio of the fluid path through the apertures as shown above. In this configuration, the step of providing a wicking structure in the metal substrate 210 may be eliminated because the intermediate substrates 600 provide suitable capillary action in multiple directions through their channels 611, 613. The surface 617 of the metal substrate 210 in communication with the vapor chamber is flat and includes no wicking structure of its own. Thus, wicking of the working fluid throughout the ground plane can be tailored to a desirable level while using a simpler flat metal substrate as opposed to a metal substrate 210 having a wicking structure such as grooves 622. Thus, the thermal ground plane shown in FIG. 27 has no wicking structure in the metal substrate 210 that conducts heat into or out of the thermal ground plane and the intermediate substrates 600 are the only wicking structure. As such, the thermal ground plane shown in FIG. 27 provides may provide a cost savings by having no wicking structure in the metal substrate 210 or in the backplane 120. This construction in FIG. 27 illustrates having no wicking structure in any of the outermost structure (namely the backplane 120 and metal substrate 210) yet provides a highly customizable construction through configuration of the intermediate substrates 600. Once a thermal ground plane is configure with its intermediate substrates 600 to have the desired wicking properties, the intermediate substrates 600 can serve as the only wicking structure in the entire thermal ground plane.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Accordingly, the exemplary implementations set forth above, are intended to be illustrative, not limiting.

The invention claimed is:

1. A thermal ground plane comprising:
   a metal substrate having a surface within a vapor chamber;
   said vapor chamber in communication with said surface of said metal substrate;
   an intermediate substrate within said vapor chamber having a first set of cross members in one direction and a second set of cross members in another direction connected to said first set of cross members, said first set of cross members being in a separate and adjacent plane from said second set of cross members, said first set of cross members defining channels between said cross members adjacent within said first set, and said second set of cross members defining channels between said cross members adjacent within said second set, said channels between said first set of cross members and said channels between said second set of cross members intersecting to form apertures bounded by said cross members;
   a second intermediate substrate within said vapor chamber having a first set of cross members in one direction and a second set of cross members in another direction connected to said first set of cross members in said second intermediate substrate, said first set of cross members in said second intermediate substrate being in a separate and adjacent plane from said second set of cross members in said second intermediate substrate, said first set of cross members in said second intermediate substrate defining channels between said cross members adjacent within said first set within said second intermediate substrate, and said second set of cross members within said second intermediate substrate defining channels between said cross members adjacent within said second set within said second intermediate substrate, said channels between said first set of cross members in said second intermediate substrate and said channels between said second set of cross members in said second intermediate substrate intersecting to form second apertures bounded by said cross members in said second intermediate substrate, said second intermediate substrate being adjacent to said intermediate substrate and said second apertures in said second intermediate substrate being shifted from said apertures in said intermediate substrate to define a fluid path through said apertures in said first and second intermediate substrates, said fluid path being narrower than a narrowest dimension of either of said apertures in said first or second apertures in said second intermediate substrate; and a fluid contained within said thermal ground plane for transporting thermal energy from a region of the said thermal ground plane to another region of the said thermal ground plane, wherein said fluid is driven by capillary forces in at least two directions along said channels between cross members of each said intermediate substrate.

2. The thermal ground plane of claim 1, further comprising a backplane opposite to and spaced from said metal substrate said backplane including supports extending from said backplane to one of said intermediate substrates nearest said backplane.

3. The thermal ground plane of claim 2, wherein said surface of said substrate within said vapor chamber includes a wicking structure having a plurality of grooves and said grooves are in communication with said apertures of said intermediate substrates.

4. The thermal ground plane of claim 1, wherein said first and second set of cross members are orthogonal with respect to each other.

5. The thermal ground plane of claim 1, wherein said intermediate substrates acts as the only wicking structure.

6. A thermal ground plane comprising:
a metal substrate having a surface within a vapor chamber;
a first intermediate substrate within said vapor chamber overlying said surface of said metal substrate and having a first set of cross members in one direction and a second set of cross members in another direction, said first set of cross members being in a separate and adjacent plane from said second set of cross members, said first set of cross members defining channels between adjacent cross members within said first set, and said second set of cross members defining channels between adjacent cross members within said second set, said channels between said first set of cross members and said channels between said second set of cross members intersecting to form first apertures bounded by said cross members;

a second intermediate substrate within said vapor chamber overlying said first intermediate substrate having a first set of cross members in one direction and a second set of cross members in another direction, said first set of cross members being in a separate and adjacent plane from said second set of cross members, said first set of cross members defining channels between adjacent cross members within said first set, and said second set of cross members defining channels between adjacent cross members within said second set, said channels between said first set of cross members and said channels between said second set of cross members intersecting to form second apertures bounded by said cross members, said apertures in said second intermediate substrate are offset from said apertures in said second intermediate substrate to define a fluid path through said apertures in said first and second intermediate substrates, said fluid path being narrower than a narrowest dimension of either of said apertures in said first or second intermediate substrates; and a fluid contained within said thermal ground plane for transporting thermal energy from a region of the thermal ground plane to another region of the said thermal ground plane, wherein said fluid is driven by capillary forces in at least two directions along said channels between cross members of said intermediate substrates.

7. The thermal ground plane of claim 6, further comprising a backplane opposite to and spaced from said metal substrate said backplane including supports extending from said backplane to said intermediate substrate nearest said backplane.

8. The thermal ground plane of claim 7, wherein said first and second sets of cross members in one of said intermediate substrates are orthogonal with respect to each other.

9. The thermal ground plane of claim 6, wherein said intermediate substrates act as the only wicking structure.

10. The thermal ground plane of claim 6, wherein said surface of said metal substrate within said vapor chamber includes a wicking structure having a plurality of grooves and said grooves are in communication with said apertures of said intermediate substrates.

11. The thermal ground plane of claim 10, wherein said surface of said metal substrate includes ridges, and said ridges contacting said intermediate substrate adjacent to said ridges.

* * * * *